(12) United States Patent
Kawai

(10) Patent No.: US 10,998,895 B2
(45) Date of Patent: May 4, 2021

(54) ELECTRONIC CIRCUIT

(71) Applicant: KABUSHIKI KAISHA TOSHIBA, Minato-ku (JP)

(72) Inventor: Shusuke Kawai, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/814,698

(22) Filed: Mar. 10, 2020

(65) Prior Publication Data
US 2021/0075413 A1 Mar. 11, 2021

(30) Foreign Application Priority Data
Sep. 9, 2019 (JP) .............................. JP2019-163991

(51) Int. Cl.
*H03M 1/00* (2006.01)
*H03K 5/24* (2006.01)
(Continued)

(52) U.S. Cl.
CPC .............. *H03K 5/2481* (2013.01); *H03K 5/13* (2013.01); *H03K 5/249* (2013.01); *H03M 1/12* (2013.01); *H03K 2005/00019* (2013.01)

(58) Field of Classification Search
CPC .......... H03M 1/50; H03M 3/43; H03M 3/456; H03M 3/474; H03M 3/344; H03M 3/506;
(Continued)

(56) References Cited

U.S. PATENT DOCUMENTS 5,982,309 A * 11/1999 Xi ........................... H03M 9/00
341/101
7,304,530 B2 * 12/2007 Wei ....................... H02M 3/073
327/390
(Continued)

FOREIGN PATENT DOCUMENTS

JP 2008-118545 A 5/2008
JP 2011-182188 A 9/2011
(Continued)

OTHER PUBLICATIONS

Xicheng Jiang, et. al., "A 1-GHz Signal Bandwidth 6-bit CMOS ADC With Power-Efficient Averaging" IEEE Journal of Solid-State Circuits, vol. 40, No. 2, Feb. 2005, 4 pages.
(Continued)

*Primary Examiner* — Linh V Nguyen
(74) *Attorney, Agent, or Firm* — Oblon, McClelland, Maier & Neustadt, L.L.P.

(57) ABSTRACT

According to one embodiment, an electronic circuit includes a first delay element, a second delay element, a first hold circuit and a quantization circuit. The first delay element obtains a first signal by delaying a first pulse signal. The second delay element obtains a second signal by delaying the first signal. The first hold circuit holds a first voltage of an input signal corresponding to the first signal. The second hold circuit holds a second voltage of the input signal corresponding to the second signal. The quantization circuit obtains a third signal and a fourth signal each with different rising times based on a second pulse signal, to quantize the first voltage based on the third signal, and to quantize the second voltage based on the fourth signal.

20 Claims, 21 Drawing Sheets

(51) Int. Cl.
*H03M 1/12* (2006.01)
*H03K 5/13* (2014.01)
*H03K 5/00* (2006.01)

(58) Field of Classification Search
CPC ............ H03M 1/08; H03M 1/14; H03M 1/46;
H03M 1/462; H03M 1/56; H03M 1/60;
H03M 7/165; H03M 9/00; H03M 1/1215;
H03M 1/1245; H03M 1/0836; H03M
1/0624; H03M 1/0604; H03M 1/0607;
H03M 1/1009; H03M 1/1038; H03M
1/12; H03M 1/468; H03M 1/0818; H03M
1/124; H03M 1/36; H03M 3/47
USPC .................................. 341/122, 141, 158, 159
See application file for complete search history.

(56) References Cited

U.S. PATENT DOCUMENTS

| | | | |
|---|---|---|---|
| 7,511,537 B2 | 3/2009 | Kimura | |
| 7,778,320 B2* | 8/2010 | Agazzi | H04L 25/03292 |
| | | | 375/229 |
| 8,330,499 B2 | 12/2012 | Hirose et al. | |
| 8,598,914 B2 | 12/2013 | Nishijima et al. | |
| 8,884,653 B2 | 11/2014 | Inoue | |
| 9,244,102 B2 | 1/2016 | Kikuchi | |
| 2001/0048729 A1* | 12/2001 | Martin | G11C 27/02 |
| | | | 375/354 |
| 2002/0105339 A1* | 8/2002 | Nagaraj | H03M 1/1009 |
| | | | 324/601 |
| 2005/0201455 A1* | 9/2005 | Wilson | H04L 25/03133 |
| | | | 375/232 |
| 2006/0232760 A1* | 10/2006 | Asbrock | G01S 17/42 |
| | | | 356/4.03 |
| 2010/0194620 A1* | 8/2010 | Kijima | H03M 1/0809 |
| | | | 341/159 |
| 2015/0130513 A1* | 5/2015 | Landolt | H03K 3/42 |
| | | | 327/94 |

FOREIGN PATENT DOCUMENTS

| | | |
|---|---|---|
| JP | 4777861 B2 | 9/2011 |
| JP | 2011-259036 A | 12/2011 |
| JP | 4988883 B2 | 8/2012 |
| JP | 2013-153288 A | 8/2013 |
| JP | 5545045 B2 | 7/2014 |
| JP | 5648690 B2 | 1/2015 |
| JP | 5877074 B2 | 3/2016 |
| JP | 2019-97121 A | 6/2019 |
| WO | WO 2012/035882 A1 | 3/2012 |

OTHER PUBLICATIONS

Toshiaki Yamagishi, et al., "A Low-kickback and Low-noise Comparator", A Study on Low Kickback and Low Noise Comparators Papers at the Society Conference of the Institute of Electronics, Information and Communication Engineers 2010_Electronics (2), 69, Aug. 31, 2010, 3 pages.

Bernhard Goll, et al., "A Clocked, Regenerative Comparator in 0.12μm CMOS with Tunable Sensitivity", Institute of Electrical Measurements and Circuit Design, 2007, 4 pages.

* cited by examiner

OPERATION EXAMPLE #2

37: COMPARATOR

ELECTRONIC CIRCUIT

CROSS-REFERENCE TO RELATED APPLICATIONS

This application is based upon and claims the benefit of priority from Japanese Patent Application No. 2019-163991, filed on Sep. 9, 2019; the entire contents of which are incorporated herein by reference.

FIELD

Embodiments described herein relate generally to an electronic circuit.

BACKGROUND

For example, in power circuits such as power converters and inverters, the output signal of the power device is measured for controlling the input signal of the power device. The measured analog signal is converted to digital signals. Then, the input signal of the power device is controlled based on the digital signal.

However, it is difficult to prepare an analog-to-digital converter with sufficient performance, depending on the switching operation of the power device.

DETAILED DESCRIPTION

According to one embodiment, an electronic circuit includes a first delay element, a second delay element, a first hold circuit and a quantization circuit. The first delay element obtains a first signal by delaying a first pulse signal. The second delay element obtains a second signal by delaying the first signal. The first hold circuit holds a first voltage of an input signal corresponding to the first signal. The second hold circuit holds a second voltage of the input signal corresponding to the second signal. The quantization circuit obtains a third signal and a fourth signal each with different rising times based on a second pulse signal, to quantize the first voltage based on the third signal, and to quantize the second voltage based on the fourth signal.

Hereinafter, embodiments of the present invention will be described with reference to the drawings.

During switching operations of power devices used in power circuits, signal waveforms with radical changes are generated in some cases. To control the input signal of the power device, analog-to-digital conversion of signal waveforms including radical changes is necessary. The same requirement exists for circuits used for other purposes such as information processing, communication, measurements, image processing, and sound processing. By increasing the sampling rate of the analog-to-digital converter, signal waveforms including radical changes can be handled.

For example, technologies for accelerating individual analog-to-digital converters are being developed. However, it is not easy to speed up all the elements included in every circuit block of the analog-to-digital converters. Also, it is possible to use interleaving to drive a plurality of analog-to-digital converters, yielding a higher sampling rate compared to cases when individual analog-to-digital converters are used. However, in this method, increased circuit scales and costs cannot be avoided. In the following, electronic circuits enabling analog-to-digital conversion of signal waveforms including radical changes while reducing the circuit scale and costs are described.

Figure 1:
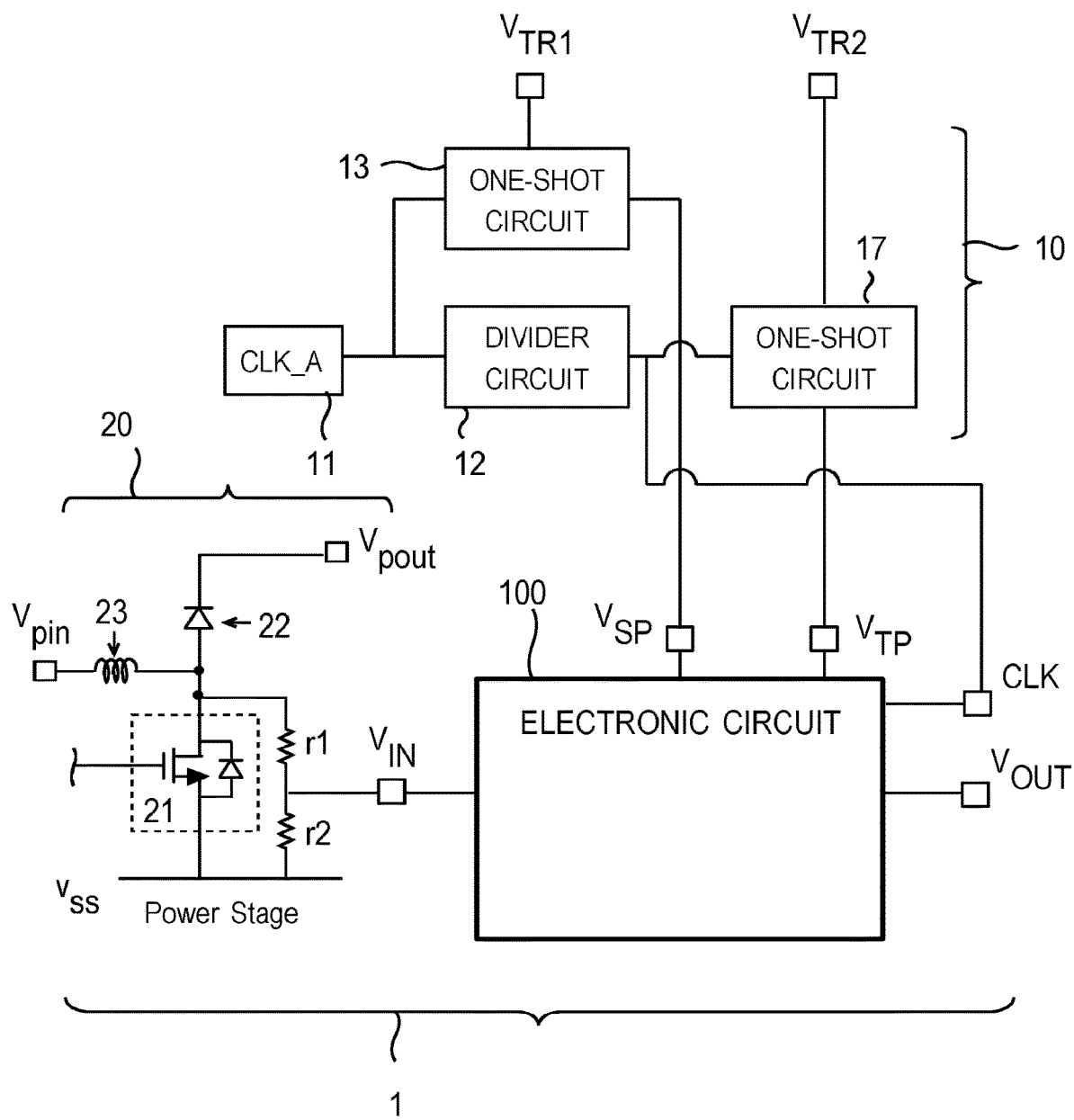
FIG. 1 is a diagram presenting an example of a circuit system according to an embodiment.

FIG. 1 is a diagram presenting an example of a circuit system according to an embodiment. Circuit system 1 in FIG. 1 includes a signal generation circuit 10, a power circuit 20 and an electronic circuit 100. The signal generation circuit 10 is connected to terminals $V_{SP}$, $V_{TP}$ and CLK of the electronic circuit 100. Also, the power circuit 20 is connected to the electronic circuit 100 via the terminal $V_{IN}$. The electronic circuit 100 is configured to execute the analog-to-digital conversion of the time domain waveform of the signal entered via the terminal $V_{IN}$, for at least some of the time intervals. The electronic circuit 100 outputs the digitalized signal from the terminal $V_{OUT}$.

The signal generation circuit 10 includes a clock generator 11, a divider circuit 12, an one-shot circuit 13 and an one-shot circuit 17. The clock generator 11 is connected to the divider circuit 12 and the one-shot circuit 13. The one-shot circuit 13 is connected to the terminal $V_{SP}$ of the electronic circuit 100. Also, the divider circuit 12 is connected to the one-shot circuit 17 and the terminal CLK of the electronic circuit 100. The one-shot circuit 17 is connected to the terminal $V_{TP}$ of the electronic circuit 100. The configuration of the signal generation circuit 10 represented in FIG. 1 is only an example. Therefore, it is possible to use a circuit with a different configuration to generate signals provided to the terminals VSP, VTP and CLK of the electronic circuit 100.

The power circuit 20 includes a transistor 21, a diode 22, an inductor 23, a resistor r1 and a resistor r2. For example, the transistor 21 is a n-channel field-effect transistor (FET). The inductor 23 is connected between the drain terminal of transistor 21 and the terminal $V_{pin}$. Also, the diode 22 is connected between the drain terminal of transistor 21 and the terminal $V_{pout}$.

For example, the terminal $V_{pin}$ corresponds to the input terminal of the power circuit 20. The terminal Vpout which is connected to the cathode terminal of the diode 22 corresponds to the output terminal of the power circuit 20. The source terminal of transistor 21 is connected to the ground $v_{ss}$ of the power circuit 20. For example, the reference potential of the substrate, the reference potential of signals or the ground potential can be used as ground $v_{ss}$. However, any potential can be used as the ground. The configuration of the power circuit 20 presented here is only an example. Thus, a power circuit with a different configuration can be used.

The resistors r1 and r2 are connected in series between the drain terminal of transistor 21 and the ground $v_{ss}$. A terminal $V_{IN}$ of the electronic circuit 100 is connected to a point between the resistors r1 and r2. Therefore, the drain voltage of the transistor 21 is divided by the resistors r1 and r2 and provided as the input to the electronic circuit 100 via the terminal $V_{IN}$. The terminal $V_{IN}$ corresponds to the input terminal of the electronic circuit 100.

The electronic circuit 100 measures the output signal of the power circuit 20. However, the electronic circuit can measure other signals. For example, the electronic circuit can measure signals provided from circuits other than power circuits. For example, the electronic circuit can measure circuits used for other purposes such as information processing, communication, measurements, image processing or sound processing. In the power circuit 20, a field-effect transistor (FET) having a n-channel is used as the power device. Examples of FETs include MOSFETs, JFETs and MESFETs. However, other power devices (semiconductor devices) such as p-channel FETs, bipolar transistors, thyristors and IGBTs can be used in the power circuit. Details of the electronic circuit 100 are described later.

Figure 2:
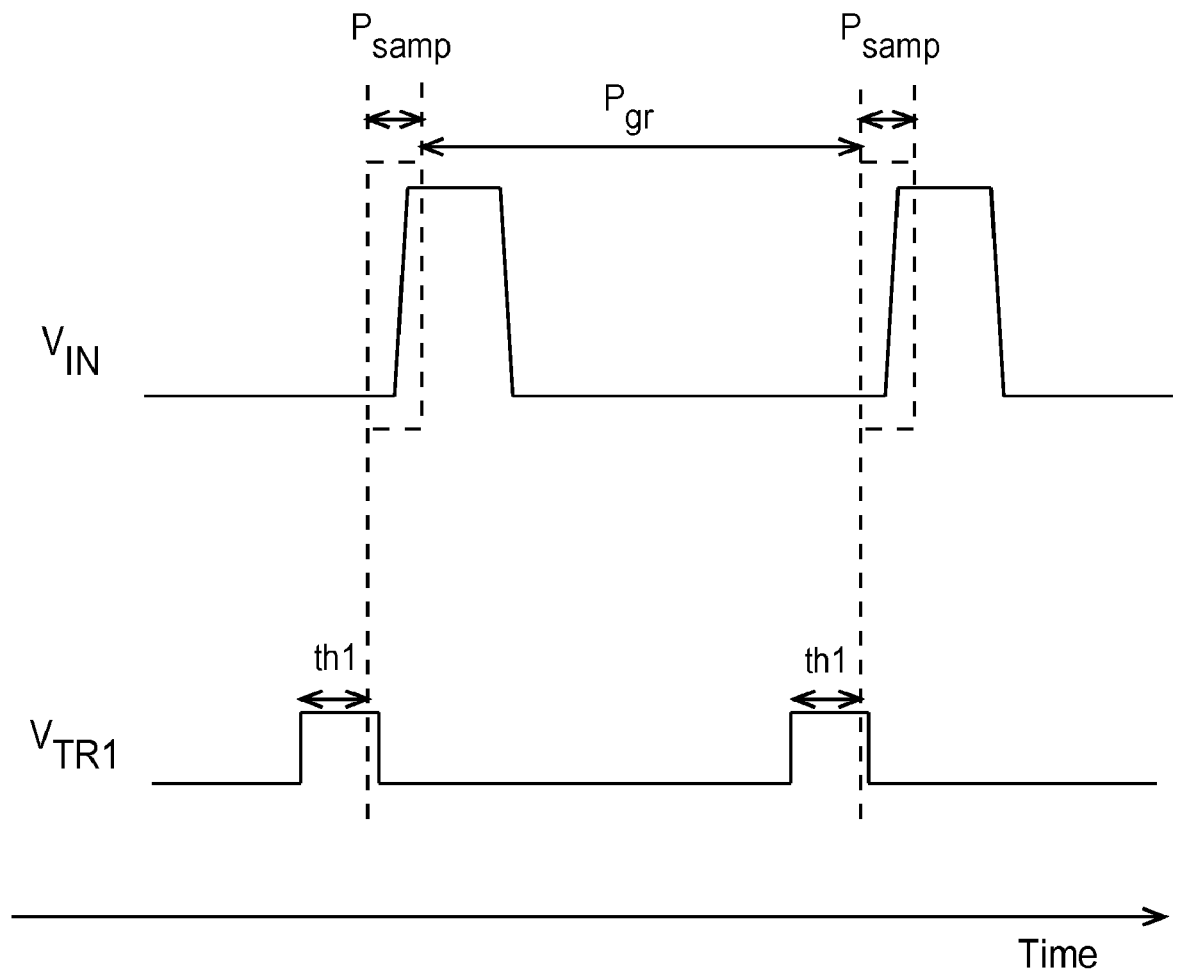
FIG. 2 is a diagram presenting an example of a sampling period of a signal waveform.
Figure 3:
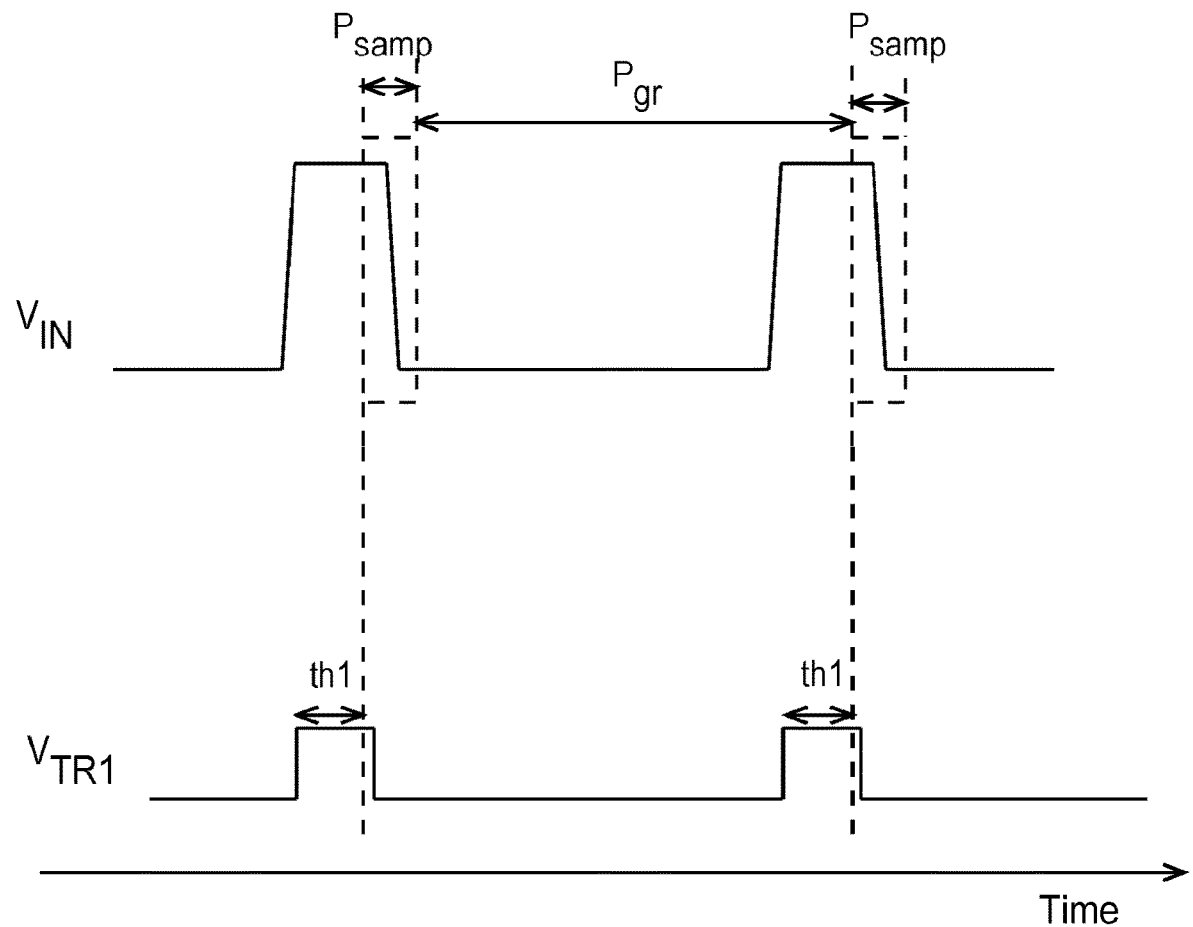
FIG. 3 is a diagram presenting an example of a sampling period of the signal waveform.

FIG. 2 and FIG. 3 are diagrams presenting examples of sampling periods of a signal waveform. In both FIG. 2 and FIG. 3, the horizontal axis indicates the time. Also, in both FIG. 2 and FIG. 3, the waveforms of the voltage signals are presented. However, the electronic circuit can measure and sample other types of signals such as current signals. The top side of FIG. 2 and FIG. 3 present waveforms of the signal provided to the electronic circuit 100 via the terminal $V_{IN}$ (referred to as the input signal). The bottom sides of FIG. 2 and FIG. 3 present voltage waveforms at the terminal $V_{TR1}$ of the signal generation circuit.

In both FIG. 2 and FIG. 3, $P_{amp}$ indicates the period when sampling of signals is executed by the electronic circuit 100. This $P_{amp}$ period is called the sampling period. Also, $P_{gr}$ indicates the periods between a sampling period and the next sampling period. Period $P_{gr}$ is called the intermediate period. The example sampling period $P_{samp}$ presented in FIG. 2 includes the rising period of the pulse in the input signal. Also, the example sampling period $P_{samp}$ presented in FIG. 3 includes the falling period of the pulse in the input signal. The sampling period $P_{amp}$ presented in FIG. 2 and FIG. 3 are only examples. Therefore, the sampling period $P_{samp}$ can be set in different timings or conditions. If the sampling of input signals is executed in a plurality of timings, the sampling period can be set to a constant length. Also, the sampling periods can be set to variable lengths. The plurality of sampling periods can be distributed periodically in the time domain. Also, the plurality of sampling periods can be distributed randomly in the time domain.

Referring to the trigger signal (voltage of the terminal $V_{TR1}$) in FIG. 2 and FIG. 3, it can be understood that the fall of the pulse in the voltage signal arrives at a timing immediately before the start of the sampling period $P_{samp}$. As it will be described below, when the pulse of the trigger signal satisfies the predetermined condition, the electronic circuit 100 samples the signals input from the terminal $V_{IN}$. For example, the trigger signal can be generated so that a timing when a gate voltage of the transistor 21 exceeds a threshold is synchronized with a timing when the pulse is supplied to the terminal $V_{TR1}$. For such synchronization, for example, a drive circuit of the transistor 21 can be used to generate the trigger signal. It can be noted that the pulse of the trigger signal can be generated at different timings. Also, any circuit can be used as the circuit which generates the trigger signal.

As presented in FIG. 2 and FIG. 3, the sampling process can be performed during a partial period (for example, the sampling period $P_{samp}$) of the signal waveform, instead of performing the sampling during the entire period of the signal waveform. For example, only the part including a steep change in the signal waveform can be sampled. In a period when the sampling is not performed (grace period $P_{gr}$), a quantization process on sampled signals can be executed. Thusway, the sampling process and the quantization process are not executed at the same clock, and the sampling process and the quantization process can be executed at different clocks. That is, the sampling process and the quantization process do not necessarily need to be synchronized. For example, a part of a period of the signal waveform can be sampled in an upstream part of the electronic circuit 100 (sampling process), and the sampled signals can be quantized in a downstream part of the electronic circuit 100 (quantization process). For example, a clock frequency $f_f$ in the upstream part of the electronic circuit 100 and a clock frequency $f_b$ in the downstream part of the electronic circuit 100 can be set so that $f_f > f_b$ is satisfied. With regard to the sampled signals, the quantization process can be started sequentially. Therefore, the period $P_{samp}$ when the sampling of signals is performed can be overlapping with a part of the period when the quantization process is performed.

Figure 4:
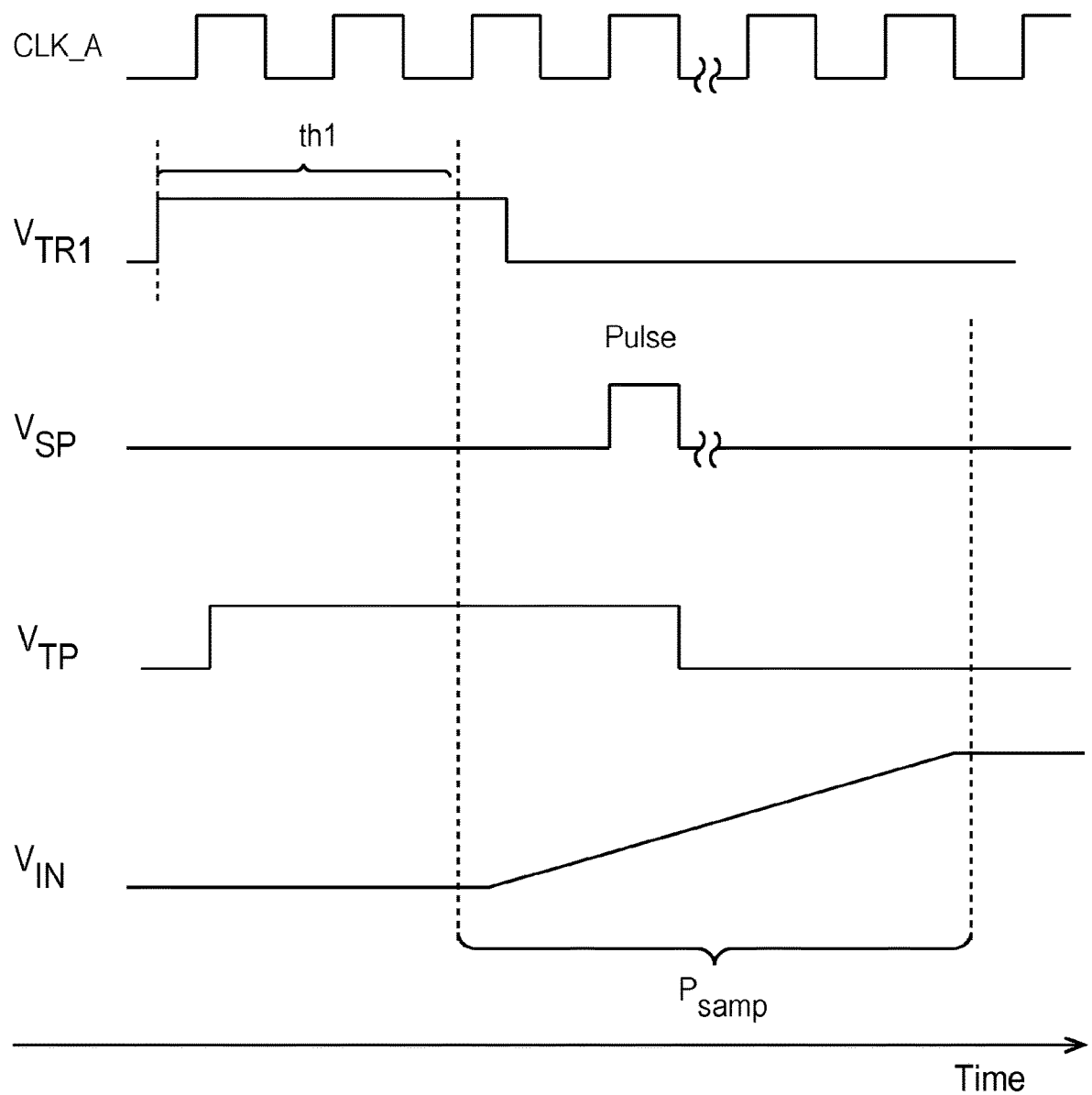
FIG. 4 is a timing chart representing an example of a signal waveform in the circuit system.

FIG. 4 presents an example of a signal waveform in the circuit system 1. In the timing chart of FIG. 4, a voltage waveform of the signal (CLK_A) generated by the clock generator 11, the voltage waveform of the trigger signal at the terminal $V_{TR1}$ of the one-shot circuit 13, the voltage waveform at the terminal $V_{SP}$ of the electronic circuit 100, the voltage waveform at the terminal $V_{TP}$ of the electronic circuit 100, and the voltage waveform at the terminal $V_{IN}$ of the electronic circuit 100 are presented, respectively.

The voltage waveform of the signal CLK includes a periodic pulse. When a pulse longer than the threshold th1 is supplied to the terminal $V_{TR1}$, the one-shot circuit 13 supplies the signal generated by the clock generator 11 for a certain period (for example, $P_{samp}$). The signal supplied by the one-shot circuit 13 corresponds to the first pulse signal supplied to the terminal $V_{SP}$. The first pulse signal is a signal for controlling the timing when the sampling is performed in the electronic circuit 100. The pulse ($V_{SP}$ in FIG. 4) in the first pulse signal specifies the timing when the signal input from $V_{IN}$ of the electronic circuit 100 is being sampled.

The signal generated by the clock generator 11 is supplied to the divider circuit 12. The divider circuit 12 generates a signal (CLK_B) obtained by multiplying a frequency of the signal CLK_A supplied from the clock generator 11 by 1/m (m is a positive integer). The signal CLK_B is supplied to the one-shot circuit 17 and the terminal CLK of the electronic circuit 100. The signal CLK_B is used as a clock during the quantization process in the downstream of the electronic circuit 100. If the signal generation circuit 10 is used, the clock frequency $f_f$ in the upstream part of the electronic circuit 100 and the clock frequency $f_b$ in the downstream of the electronic circuit 100 satisfy a relational expression of $f_f=(1/m)f_b$. The value of m can be determined according to a frequency at which an analog-to-digital converter 30 used in the electronic circuit 100 or a comparator can operate.

If a pulse with duration longer than a threshold th2 is supplied to the terminal $V_{TR2}$, the one-shot circuit 17 supplies the signals provided from the divider circuit 12 to the terminal $V_{TP}$ for a certain period (for example, $P_{adc}$). The waveform of the period $P_{adc}$ among the signals supplied from the divider circuit 12 is supplied to the terminal $V_{TP}$. With reference to the voltage waveform at the terminal $V_{TP}$, the period of the pulse is m times as long as the signal CLK_A. A second pulse signal supplied to the terminal $V_{TP}$ specifies the timing of the quantization process in the electronic circuit 100.

Next, the configuration of the electronic circuit 100 will be described.

Figure 5:
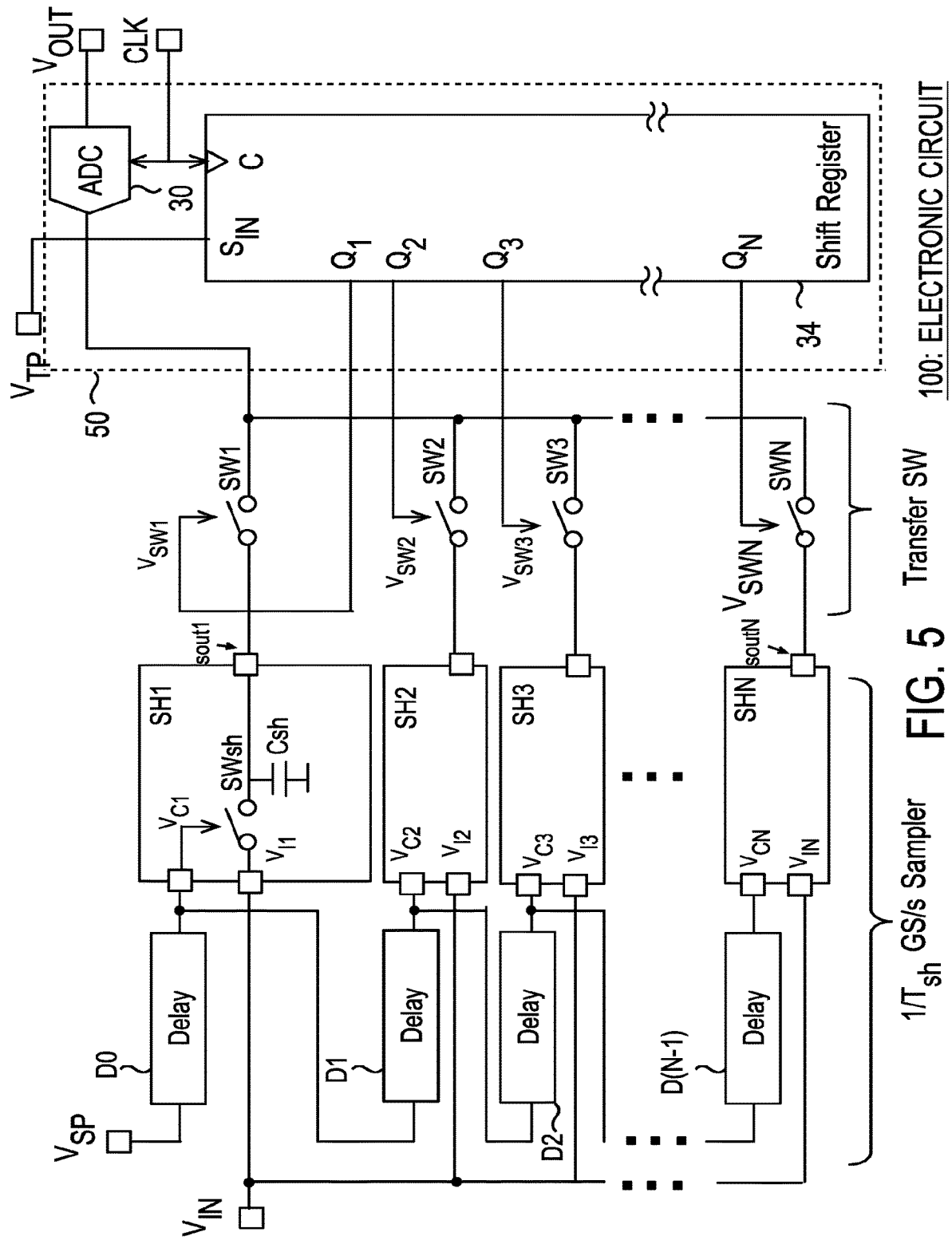
FIG. 5 is a circuit diagram representing an example of an electronic circuit according to an embodiment.

FIG. 5 is a circuit diagram presenting an example of the electronic circuit according to an embodiment. The electronic circuit 100 in FIG. 5 includes N delay elements (delay elements D0 to D(N−1)), N sample-hold circuits (sample-hold circuits SH1 to SHN), N switches (switches SW1 to SWN), a shift register 34, and the analog-to-digital converter 30. Here, if the number of the sample-hold circuits is equal to the number of delay elements will be described as an example. It is noteworthy that the delay element D0 connected to a terminal $V_{C1}$ of the sample-hold circuit SH1 can be omitted. In this case, the electronic circuit includes at least (N−1) delay elements connected in series. Herein, the sample-hold circuit is an example of a holding circuit.

In FIG. 5, the upstream part of the electronic circuit 100 includes the delay elements D0 to D(N−1) and the sample-hold circuits SH1 to SHN. Also, the downstream part of the electronic circuit 100 includes the switches SW1 to SWN and a quantization circuit 50. The quantization circuit 50 includes the shift register 34 and the analog-to-digital converter 30.

Thus, the electronic circuit can include a first delay element, a second delay element, a first hold circuit, a second hold circuit and a quantization circuit. The first delay element can obtain a first signal by delaying a first pulse signal. The second delay element can obtain a second signal by delaying the first signal. The first hold circuit can hold a first voltage of an input signal corresponding to the first signal. The second hold circuit can hold a second voltage of the input signal corresponding to the second signal. The quantization circuit can obtain a third signal and a fourth signal each with different rising times based on a second pulse signal, to quantize the first voltage based on the third signal, and to quantize the second voltage based on the fourth signal.

The electronic circuit can further include a first switch and a second switch. The first switch can be connected to the first hold circuit and the quantization circuit, and can be switched according to the third signal. The second switch can be connected the second hold circuit and the quantization circuit, and can switch according to the fourth signal. The quantization circuit can quantize the first voltage according to a switching of the first switch and can quantize the second voltage according to a switching of the second switch.

The quantization circuit can include a shift register and an analog-to-digital converter. The shift register can obtain the third signal and the fourth signal by delaying the second pulse signal according to a clock signal, and can provide the third signal to the first switch and can provide the fourth signal to the second switch. The analog-to-digital converter can be connected to the first switch and the second switch.

Here, the first signal can rise earlier than the third signal. Also, the pulse width of the second signal can be greater than a pulse width of the first signal.

Figure 6:
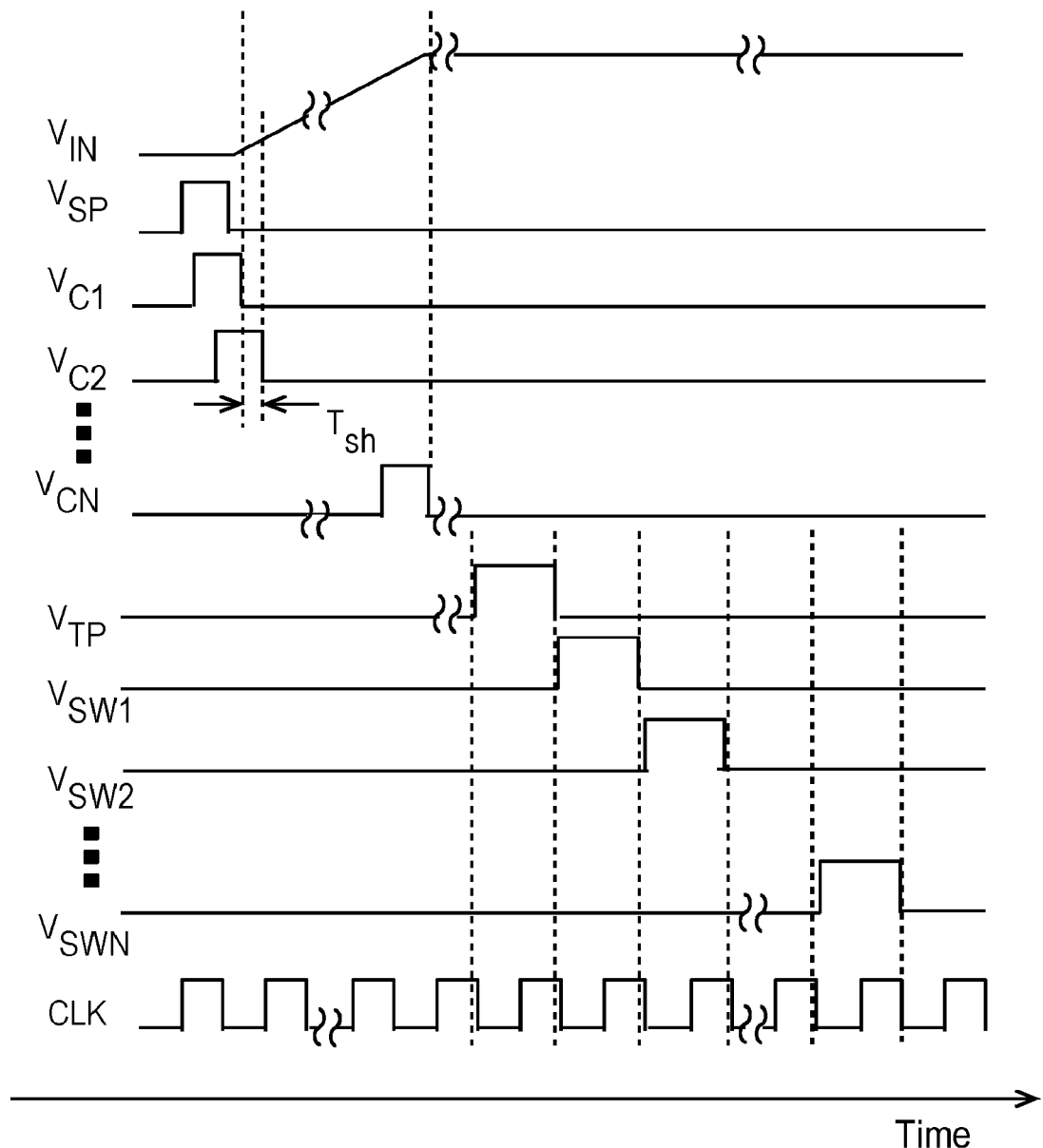
FIG. 6 is a timing chart representing an example of a signal waveform in the electronic circuit.

FIG. 6 is a timing chart presenting an example of the signal waveform in the electronic circuit 100. FIG. 6 presents the voltage waveform of the signal (input signal) at the terminal $V_{IN}$ and the voltage waveform of the first pulse signal at the terminal $V_{SP}$, the voltage waveform of the signal at the terminal $V_{Cx}$ (x=1, 2, . . . , N), the voltage waveform of the second pulse signal at the terminal $V_{TP}$, the voltage waveform of the signal at the control terminal $V_{SWx}$ (x=1, 2, . . . , N) of the switch SWx, and the voltage waveform of the signal at the terminal CLK, respectively. In FIG. 6, the horizontal axis corresponds to the time. As presented in FIG. 6, the first pulse signal and the second pulse signal may respectively have different rise times. Also, as presented in FIG. 6, the pulse width of the second pulse signal can be greater than the pulse width of the first pulse signal.

First, the upstream part of the electronic circuit 100 will be described. The sample-hold circuit SHx (x=1, 2, . . . , N) includes the terminal $V_{Cx}$ (referred to as a logical terminal), the terminal $V_{Ix}$ (referred to as an analog terminal), and a terminal soutx. Each of the logical terminals $V_{Cx}$ is connected to either of the delay elements. The analog terminal $V_{Ix}$ is connected to the terminal $V_{IN}$. The first pulse signals subjected to different time delays are supplied to the respective logical terminal $V_{Cx}$. Also, the signals are supplied from the terminal $V_{IN}$ to the respective analog terminals $V_{Ix}$.

Each of the sample-hold circuits holds the voltage level of the analog terminal $V_{Ix}$ (referred to as a sampling voltage) at the timing when a pulse reaches the logical terminal $V_{Cx}$. For example, when a switch SWsh is ON (conductive state), the sample-hold circuit can store the voltage level of the analog terminal $V_{Ix}$ by accumulation of charges in the capacitance Csh (sample mode). Then, the sample-hold circuit turns the switch SWsh OFF at a timing when the pulse reaches the logical terminal $V_{Cx}$ (for example, the fall timing of the pulse). Thus, the sample-hold circuit can supply the signal with a voltage level corresponding to the timing immediately before the pulse reaches the logical terminal $V_{Cx}$, from the terminal sout (hold mode). The sample-hold circuit can be implemented by using, for example, a voltage follower circuit with an operation amplifier. It can be noted that a sample-hold circuit with any type of configuration can be used.

The plurality of delay elements Dx (x=0, 1, 2, . . . , N−1) connected in series delay the first pulse signals supplied from the terminal $V_{SP}$, sequentially. The delay element D1 is connected between the logical terminal $V_{C1}$ of the sample-hold circuit SH1 and the logical terminal $V_{C2}$ of the sample-hold circuit SH2. The delay element D2 is connected between the logical terminal $V_{C2}$ of the sample-hold circuit SH2 and the logical terminal $V_{C3}$ of the sample-hold circuit SH3. To generalize, the delay element Dx having the number "x"=1, ..., N is connected between the logical terminal $V_{Cx}$ of the sample-hold circuit SHx and the logical terminal $V_{C(x+1)}$ of the sample-hold circuit SH(x+1). The electronic circuit 100 in FIG. 5 includes N delay elements including the delay element D0 connected between the logical terminal $V_{C1}$ of the sample-hold circuit SH1 and the terminal $V_{SP}$. However, an electronic circuit without the delay element D0 connected between the logical terminal $V_{C1}$ of the sample-hold circuit SH1 and the terminal $V_{SP}$ can be used. In this case, the electronic circuit includes (N−1) delay elements Dx (x=1, 2, ..., N−1).

Each of the delay elements Dx (x=0, 1, ..., N−1) delays the passing signal by a delay amount Tsh. The (x+1) delay elements are connected in series between the logical terminal $V_{Cx}$ of the sample-hold circuit SHx having the number "x" of 2 or higher and the terminal $V_{SP}$. For this reason, as presented in the voltage waveforms of the signals at the logical terminals $V_{Cx}$ (x=1, 2, ..., N) in FIG. 6, the signal supplied from the terminal $V_{SP}$ is delayed according to the number of passing delay elements. For example, if the first pulse signal passes through the n delay elements, the time delay of at least n*Tsh is generated compared to the original signal.

Hereinafter, while the timing when the pulse of the first pulse signal reaches the terminal $V_{SP}$ is supposed to be time "t"=0, the timing when each of the sample-hold circuits performs the sampling will be described. First, the sample-hold circuit SH1 performs the sampling of input signals at time "t"=Tsh. Next, the sample-hold circuit SH2 performs the sampling of input signals at time "t"=2*Tsh. Then, the sample-hold circuit SH3 performs the sampling of input signals at time "t"=3*Tsh. To generalize, the sample-hold circuit SHx performs the sampling of input signals at time "t"=x*Tsh.

Thus, in the electronic circuit 100, when one pulse is supplied to the terminal $V_{SP}$, the input signals at the terminal $V_{IN}$ are sampled in the period Tsh in N times in total (the number of times equal to the number of sample-hold circuits).

In the upstream part of the electronic circuit 100, if the circuit including the delay elements connected in series is used, the input signals can be sampled at a high speed with a certain sampling rate (1/Tsh).

Next, the switches SW1 to SWN and the quantization circuit 50 of the electronic circuit 100 (downstream of the electronic circuit 100) will be described. The switches SW1 to SWN respectively turn ON/OFF in accordance with the voltages of the control terminals $V_{SW1}$ to $V_{SWN}$. The switch SWx is connected to the terminal soutx of the sample-hold circuit SHx (x=1, 2, ..., N). The control terminal of the switch SWx is connected to a terminal $Q_x$ of the shift register 34. With reference to FIG. 1 and FIG. 5, the second pulse signal supplied from the divider circuit 12 (corresponding to the voltage waveform of the signal at the terminal $V_{TP}$ in FIG. 6) is input to a terminal $S_{IN}$ corresponding to serial terminals of the shift register 34 via the terminal $V_{TP}$. Also, the clock signal CLK_B with a frequency $f_b$ is supplied to the shift register 34 via the terminal CLK and a terminal C.

The N terminals $Q_x$ (x=1, 2, ..., N) included in the shift register 34 correspond to parallel terminals of the shift register 34. The respective terminals $Q_x$ (x=1, 2, ..., N) are connected to the corresponding control terminals $V_{SWx}$ of the switch SWx. The second pulse signal is supplied with the time delay of $T_{clk}$ from the terminal $Q_1$ of the shift register 34. For this reason, the switch SW1 is controlled by the signal delayed by $T_{clk}$ with respect to the original second pulse signal. Also, the second pulse signal is supplied from the terminal $Q_2$ of the shift register 34 with the time delay of $2T_{clk}$ with respect to the voltage waveform at the terminal $V_{TP}$. For this reason, the switch SW2 is controlled by the signal delayed by $2T_{clk}$ with respect to the original second pulse signal. Similarly, from the terminal $Q_3$ of the shift register 34, the second pulse signal is supplied with the time delay of $3T_{clk}$ with respect to the voltage waveform at the terminal $V_{TP}$. For this reason, the switch SW3 is controlled by the signal delayed by $3T_{clk}$ with respect to the original second pulse signal. Thus, the pulses are supplied from the terminals $Q_x$ (x=1, 2, ..., N) of the shift register 34 in the ascending order of the number "x" (voltage waveforms of the terminals $V_{SW0}$ to $V_{SWN}$ in FIG. 6).

The switches SWx (x=1, 2, ..., N) turn ON (conductive state) at a timing when the pulse is supplied to the control terminal $V_{SWx}$. When the switches SWx turn ON, the signal supplied from the terminal soutx of the sample-hold circuit SHx is supplied to the analog-to-digital converter 30. The switches SWx sequentially turns (switches) ON respectively following the order in which the pulse is supplied from the terminals $Q_1$ to $Q_N$ of the shift register 34. Therefore, the switches SWx turn ON respectively in the ascending order of the number "x". For example, in the switches turn can turn ON respectively in the order of switch SW1, switch SW2, switch SW3, ... and switch SWN. At a timing when either of the switches SWx is turned ON, the remaining switches are turned OFF (cut-off state). For example, the switches SW2 to SWN are turned OFF while the switch SW1 is turned ON.

In the electronic circuit 100, the held sampling voltage is supplied to the analog-to-digital converter 30 from the sample-hold circuit having the lower number "x", in the ascending order. The analog-to-digital converter 30 is connected to the terminal CLK and operates by the clock signal CLK_B at frequency $f_b$. Thereby, the analog-to-digital converter 30 compares the sampling voltages supplied from the respective sampling hold circuits at the timing of the clock signal CLK_B and performs the quantization process. The quantized digital signal is output from the terminal $V_{OUT}$. The analog-to-digital converter 30 can be an analog-to-digital converter of either a flash type, an SAR type, a delta sigma type. However, the type of analog-to-digital converter is not limited.

The electronic circuit can include a plurality of delay elements Dx connected in series, a plurality of hold circuits (sample-hold circuits SHx), a plurality of switches SWx, and a quantization circuit. The plurality of first delay elements Dx connected in series delay the first pulse signals supplied from the first terminal (terminal $V_{SP}$), sequentially. The plurality of first hold circuits hold the voltages of the input signals supplied from the input terminal according to the plurality of delayed first pulse signals supplied from the plurality of first delay elements Dx. The plurality of switches SWx are connected to the plurality of hold circuits SHx, respectively. Also, a plurality of second pulse signals having different pulse widths from the first pulse signals are supplied to the plurality of switches SWx, and the plurality of switches SWx are switched sequentially according to the plurality of second pulse signals. The quantization circuit is connected to the plurality of switches SWx. The quantization circuit quantizes and outputs the voltages held in the plurality of first hold circuits according to the switching timings of the plurality of switches SWx.

As presented in FIG. 5, the quantization circuit can also include a shift register that generates a plurality of second pulse signals, at a timing synchronized with the clock signals. The shift register can supply the plurality of second pulse signals to the plurality of switches SWx. Also, the quantization circuit can also include an analog-to-digital converter connected to the plurality of switches SWx. It can be noted that the quantization circuit 50 presented in FIG. 5 is merely an example of the possible configurations of the quantization circuit.

In the electronic circuit 100, the quantization process can be performed according to a clock which is different from the clock used for the sampling process. The clock of the quantization process can be slower than the clock used in the sampling process. Thus, the quantization circuit can be configured so that a period when the switches SWx are in the conductive state switch is longer than the time delay of the signal that passes through the respective first delay elements. Also, in the example of FIG. 6, the analog-to-digital conversion is performed in the rise period of the voltage of the input signal (terminal $V_{IN}$), but as presented in the example of FIG. 3, the analog-to-digital conversion can be performed in the fall period of the voltage of the input signal.

The electronic circuit 100 described above is merely an example of the circuit that can perform the analog-to-digital conversion of the input signal. Therefore, the analog-to-digital conversion of the input signal can be performed by using an electronic circuit which has a configuration different from the aforementioned electronic circuit 100. Hereinafter, the variations of electronic circuits (electronic circuits 100 to 109) which can be used in the circuit system 1 instead of the electronic circuit 100 will be described.

(First Variation of Electronic Circuit)

Figure 7:
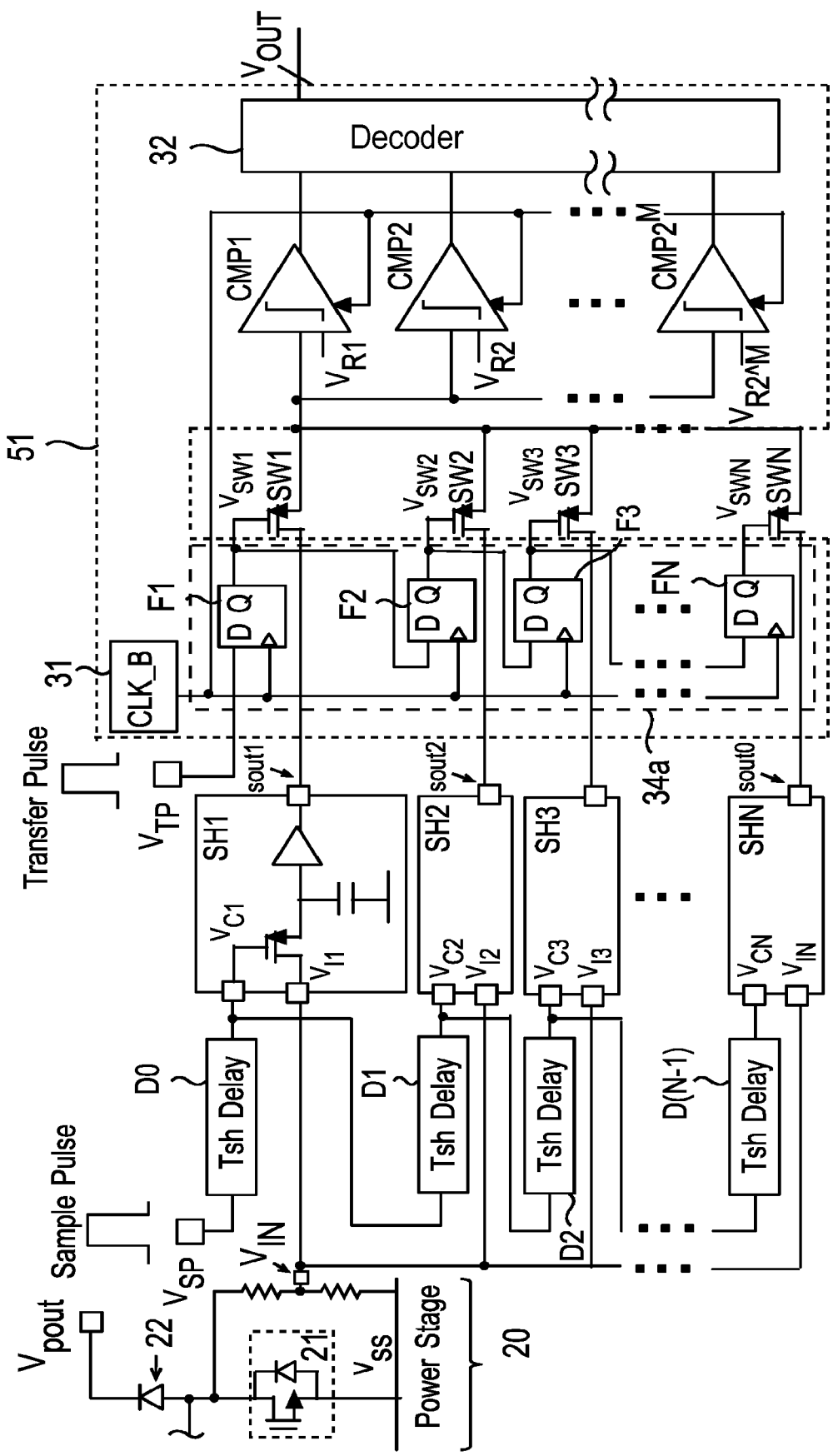
FIG. 7 is a diagram representing an electronic circuit according to a first variation.

FIG. 7 is a circuit diagram presenting an example of the electronic circuit 101. A configuration of an upstream part of the electronic circuit 101 is similar to the upstream part of the electronic circuit 100. Similar to the electronic circuit 100, in the upstream part of the electronic circuit 101, the delay element D0 connected to the logical terminal $V_{C1}$ of the sample-hold circuit SH1 can be omitted. In the following, a configuration of a plurality of switches and a quantization circuit 51 in the electronic circuit 101 corresponding to the downstream part of the electronic circuit will be described.

The quantization circuit 51 includes a clock generator 31, N D flip-flops Fx (x=1, 2, . . . , N), the N switches SWx (x=1, 2, . . . , N), the $2^M$ comparators COMPy (y=1, 2, . . . , $2^M$), and a decoder 32. Herein, "M" is an integer equal to or higher than 1. Here, the decoder 32 is an example of a conversion circuit.

The terminal soutx of the sample-hold circuit SHx (x=1, 2, . . . , N) is connected to the switch SWx. Then, the $2^M$ comparators COMPy (y=1, 2, . . . , $2^M$) are connected to the N switches SWx in parallel. All of the N switches SWx are connected to the first terminals of the $2^M$ comparators COMPy. Mutually different reference voltages $V_{R0}$ to $V_{R2[<]BEGINITALmM}$ are applied to the terminals of the $2^M$ comparators COMPy. Also, each of the comparators COMPy is connected to the decoder 32. Then, the output terminal of the decoder 32 corresponds to the terminal $V_{OUT}$ of FIG. 1.

Clock terminals of the N D flip-flops Fx (x=1, 2, . . . , N) and CLK terminals of the $2^M$ comparators COMPy (y=1, 2, . . . , $2^M$) are connected to the clock generator 31. It is noted that the clock generator 31 may be omitted, and the CLK terminals of the N D flip-flops Fx and the clock terminals of the $2^M$ comparators COMPy can be connected to the divider circuit 12 in FIG. 1.

The terminal $V_{TP}$ of the electronic circuit 101 is connected to the D terminal of the D flip-flop F1. Therefore, the second pulse signal is supplied to the D terminal of the D flip-flop F2 via the terminal $V_{TP}$. The Q terminal of the D flip-flop F0 is connected to the control terminal of the switch SW1. Therefore, the switch SW1 turns ON/OFF according to the voltage level of the Q terminal of the D flip-flop F1 (set to a conductive state or a non-conductive state). Also, the Q terminal of the D flip-flop F1 is also connected to the D terminal of the D flip-flop F2. The Q terminal of the D flip-flop F2 is connected to the control terminal of the switch SW2. Therefore, the switch SW2 turns ON/OFF according to the voltage level of the Q terminal of the D flip-flop F2. Similarly, the Q terminal of the D flip-flop F2 is also connected to the D terminal of the D flip-flop F3. A Q terminal of the D flip-flop F3 is connected to the control terminal of the switch SW3. Therefore, the switch SW3 turns ON/OFF according to the voltage level of the Q terminal of the D flip-flop F3.

It is noted that in the example of FIG. 7, the FET is used as the switch SWx (x=1, 2, . . . , N). Therefore, the control terminal of the switch SWx corresponds to the gate terminal of the FET.

Thus, the N D flip-flops Fx (x=1, 2, . . . , N) are driven by the same clock signal CLK_B, and the Q terminal of the D flip-flop Fn is connected to the D terminal of the D flip-flop F(n+1). Here, n is an integer equal to or greater than 1, and smaller than N. Thus, the N D flip-flops form a shift register 34a. By the operation of the shift register 34a, the N switches SWx turn (switch) ON sequentially in the ascending order of the number "x". Therefore, the sampling voltages of the N sample-hold circuits SHx are supplied to the $2^M$ comparators COMPy (y=1, 2, . . . , $2^M$) connected in parallel in the ascending order of the number "x". Each of the comparators COMPy supplies a HIGH or LOW signal to the decoder 32 according to the result of the comparison between the sampling voltage and the reference voltage. Then, the decoder 32 digitalizes and outputs the sampling voltage quantized by the plurality of comparators COMPy.

Thus, the quantization circuit can include a shift register, a plurality of comparators COMPy and a conversion circuit (decoder 32). The shift register is synchronized with the clock signals, generating a plurality of second pulse signals supplied to the plurality of switches SWx. The plurality of comparators COMPy are connected to the plurality of switches SWx and compare the voltages held in the plurality of first hold circuits (sample-hold circuit SHx). The conversion circuit (decoder 32) digitalizes and outputs the quantized voltages based on the comparison results of the plurality of comparators COMPy. As presented in the electronic circuit 101 in FIG. 4, a shift register can be implemented using a chain of a plurality of D flip-flops in which the Q terminal of the D flip-flop in the upstream is connected to the D terminal of the D flip-flop in the downstream.

Even when the electronic circuit 101 is used, the quantization process can be performed at clocks different from those used for the sampling process, and functions similar function to the aforementioned electronic circuit 100 can be provided.

The quantization circuit can include a shift register, a first comparator, a second comparator and a conversion circuit. The shift register can obtain the third signal and the fourth signal by delaying the second pulse signal according to a clock signal. The shift register can provides the third signal to the first switch. The shift register can also provide the fourth signal to the second switch. The first comparator can be connected to the first switch and the second switch. The first comparator can compare the first voltage and the second voltage with a first reference voltage. The second comparator can be connected to the first switch and the second switch. The second comparator can compare the first voltage and the second voltage with a second reference voltage. The conversion circuit can digitalize and output the first voltage and the second voltage based on at least either comparison of the first voltage at the first comparator, comparison of the second voltage at the first comparator, comparison of the first voltage at the second comparator and comparison of the second voltage at the second comparator.

(Second Variation of Electronic Circuit)

Figure 8:
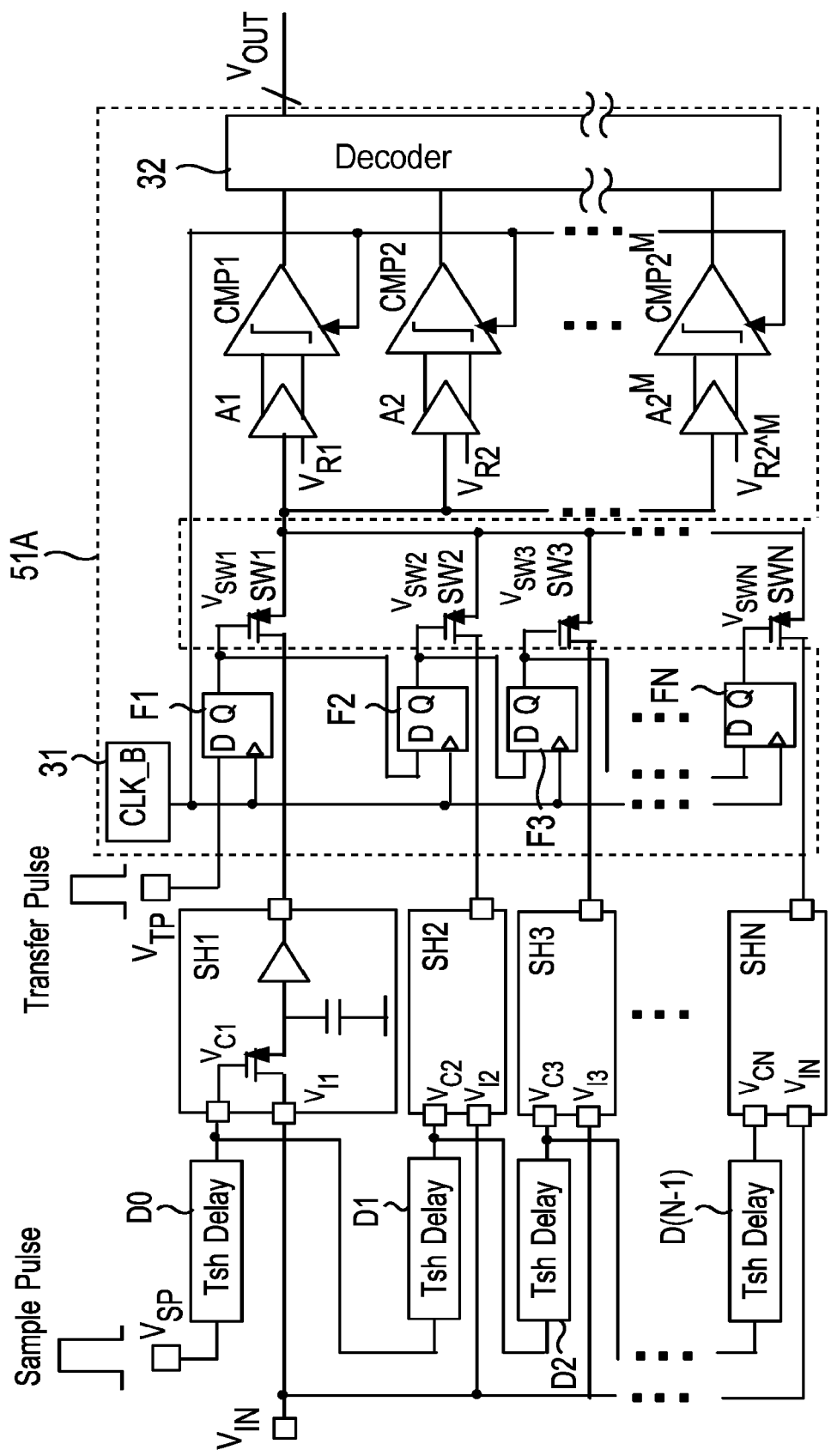
FIG. 8 is a diagram representing an electronic circuit according to a second variation.

FIG. 8 is a circuit diagram presenting an example of an electronic circuit 102. In a quantization circuit 51A of the electronic circuit 102, a differential amplifier Ay is located in an upstream part of a comparator CMPy (y=1, 2, . . . , $2^M$). Thus, the switch SWx is connected to a first terminal of the differential amplifier Ay. Here, the differential amplifier is an example of an amplifier. Also, the reference potential $V_{Ry}$ is connected to the second terminal of the differential amplifier Ay. Then, the first terminal of the differential amplifier Ay is connected to the first terminal of the comparator CMPy. Similarly, the second terminal of the differential amplifier Ay is connected to the second terminal of the comparator CMPy. According to the configuration of the electronic circuit 102, since the signal and the reference voltage are supplied to the comparator CMPy after being amplified, the noise generated during the quantization process can be reduced. Except for the addition of the differential amplifier Ay, the configuration of the other parts of the electronic circuit 102 is similar to the aforementioned electronic circuit 101.

Thus, the quantization circuit in the electronic circuit can further include a plurality of amplifiers (for example, the differential amplifiers Ay) that amplify the voltages and the reference potential held in the first hold circuits (sampling hold circuits SHx) to be supplied to the comparator CMPy. Functions similar to that of the above electronic circuit 100 or 101 can be also provided by the electronic circuit 102.

The quantization circuit can further include a first amplifier and a second amplifier. The first amplifier can amplify the first voltage, the second voltage and the first reference voltage. Also, the first amplifier can provides the first voltage, the second voltage and the first reference voltage to the first comparator. The second amplifier can amplify the first voltage, the second voltage and the second reference voltage. Also, the second amplifier can provide the first voltage, the second voltage and the second reference voltage to the second comparator.

(Third Variation of Electronic Circuit)

Figure 9:
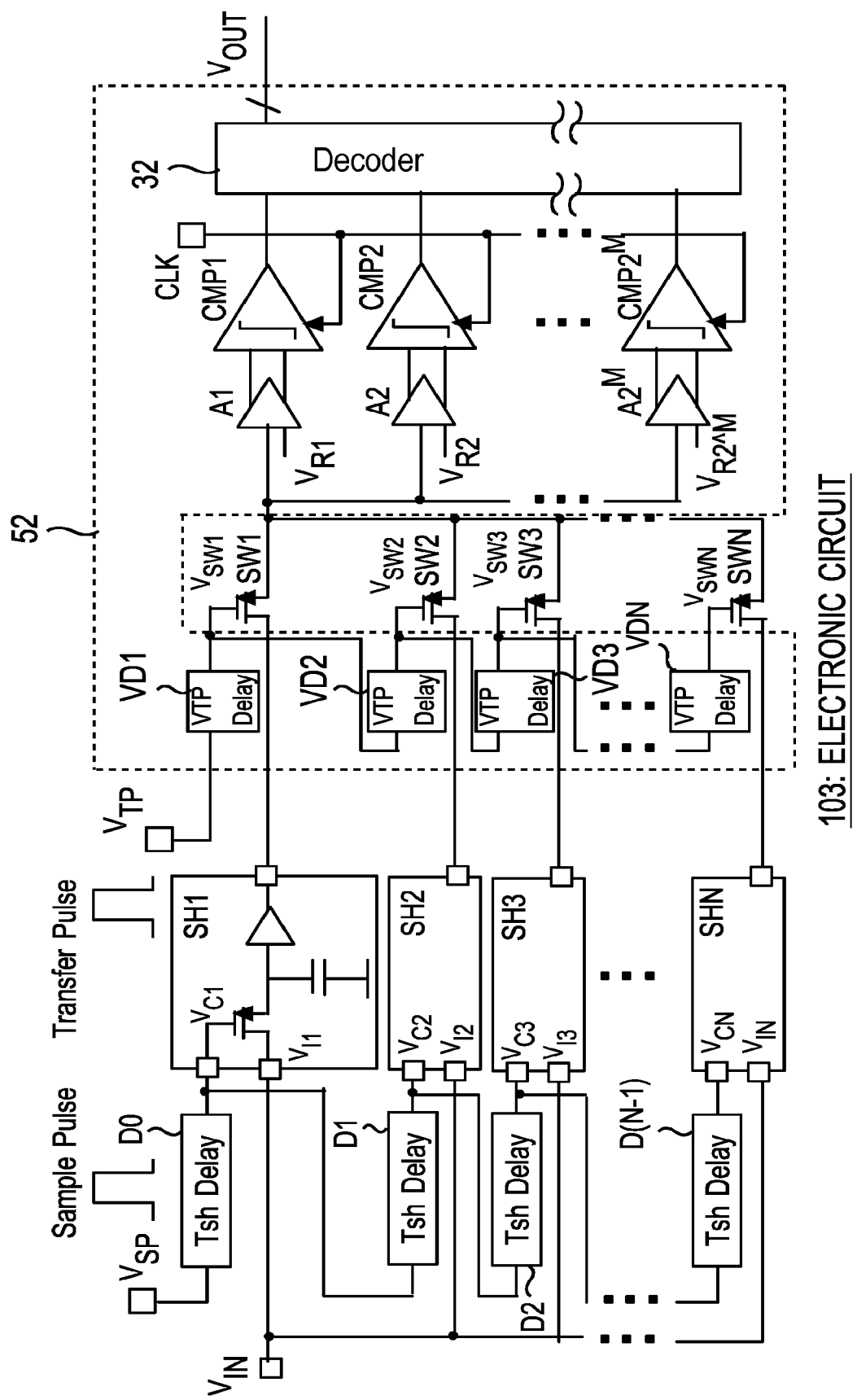
FIG. 9 is a diagram representing an electronic circuit according to a third variation.

FIG. 9 is a circuit diagram presenting an example of an electronic circuit 103. In the quantization circuit 52 of the electronic circuit 103, the delay element VDx is connected to the control terminal of the switch SWx (x=1, 2, . . . , N) instead of the Q terminal of D flip-flop Fx. Thus, in the electronic circuit 103, the N delay elements VDx are connected in series between the terminal VTP and the control terminal of the switch SWN. The delay amount of each of the delay elements VDx is set to a value equal to an inverse number 1/fb of the frequency of the clock signal CLK_B supplied from the terminal CLK. It can be noted that the terminal CLK is supplied to the divider circuit 12 in FIG. 1 or the clock generator 31 in FIG. 7 or FIG. 8. Therefore, the time delay of the signal supplied from the terminal VTP increases in accordance with the number of passing delay elements VDx. Similar to the electronic circuit 102, the N switches SWx turn ON (switch) sequentially in the ascending order of the number "x".

The sampling voltages of the N sample-hold circuits SHx are supplied sequentially to the $2^M$ comparators COMPy (y=1, 2, . . . , $2^M$) connected in parallel in the ascending order of the number "x". Each of the comparators COMPy supplies the HIGH or LOW signal to the decoder 32 according to the comparison result between the supplied voltage signal and the reference voltage. Then, the decoder 32 outputs the quantized digital signal.

Thus, the electronic circuit can include the plurality of delay elements VDx connected in series and the plurality of comparators COMPy. The plurality of delay elements VDx connected in series delay the second pulse signals, sequentially. The plurality of comparators COMPy are connected to the plurality of switches SWx and compare the voltages held in the plurality of first hold circuits (sample-hold circuit SHx). The plurality of switches SWx sequentially switch according to the plurality of delayed second pulse signals supplied from the plurality of delay elements VDx. The quantization circuit includes a conversion circuit that digitalizes and outputs the quantized voltage based on the comparison results of the plurality of the comparators COMPy. The configuration of the other parts of the electronic circuit 103 is similar to the above electronic circuit 102. Functions similar to that of the above electronic circuits 100 to 102 can be also provided by the electronic circuit 103.

The quantization circuit can include a third delay element, a fourth delay element, a first comparator, a second comparator and a conversion circuit. Here, the third delay element can obtain the third signal by delaying the second pulse signal. The fourth delay element can obtain the fourth signal by delaying the third signal. The first comparator can be connected to the first switch and the second switch. The first comparator can compare the first voltage and the second voltage with a first reference voltage. The second comparator can be connected to the first switch and the second switch. The second comparator can compare the first voltage and the second voltage with a second reference voltage. The conversion circuit can digitalize and output the first voltage and the second voltage based on at least either comparison of the first voltage at the first comparator, comparison of the second voltage at the first comparator, comparison of the first voltage at the second comparator and comparison of the second voltage at the second comparator. The third signal can be provided to the first switch from the third delay element. The fourth signal can be provided to the second switch from the fourth delay element.

(Fourth Variation of Electronic Circuit)

Figure 10:
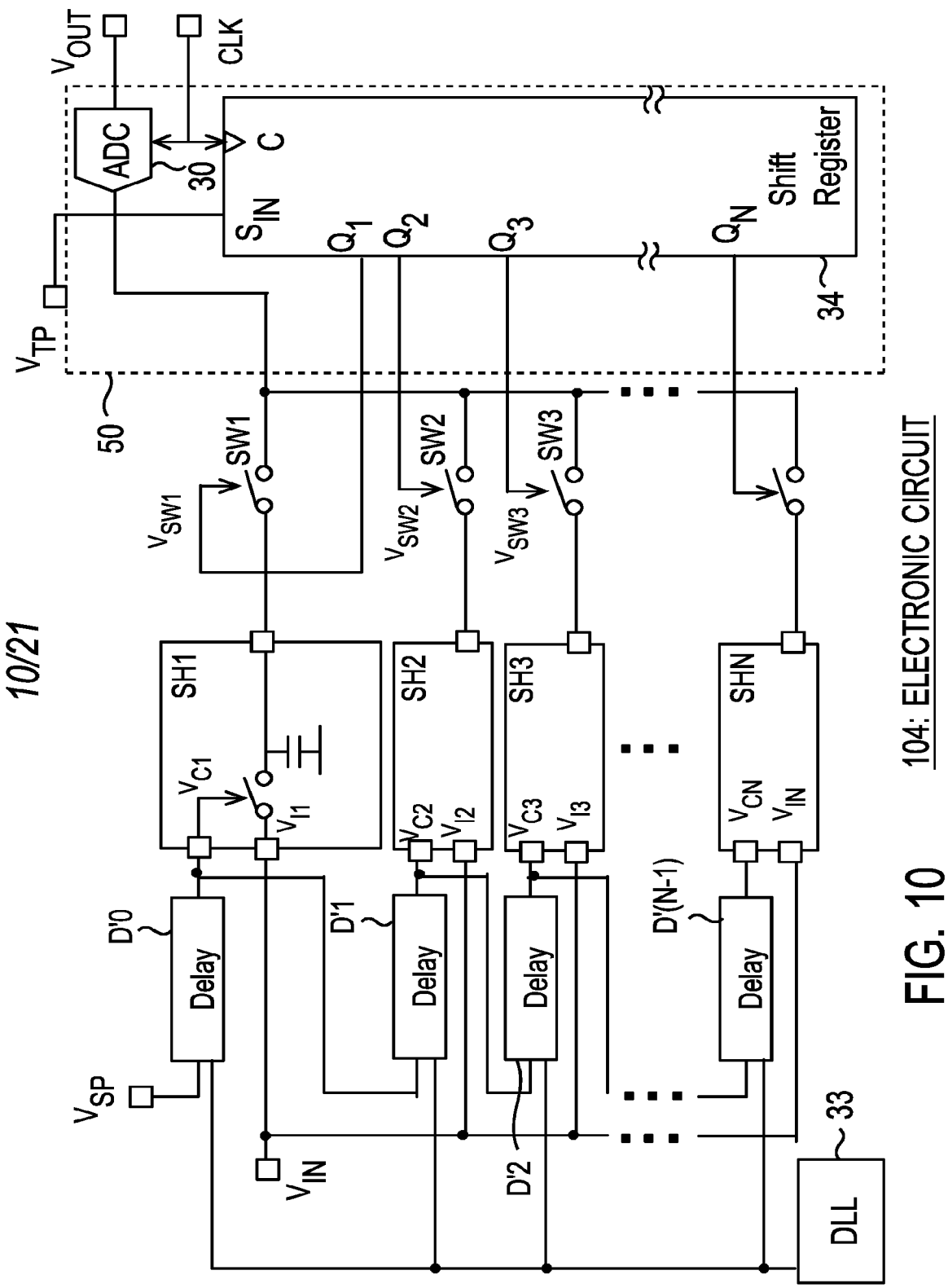
FIG. 10 is a diagram representing an electronic circuit according to a fourth variation.

FIG. 10 is a circuit diagram presenting an example of an electronic circuit 104. The electronic circuit 104 includes additional functions in addition to the functions of the above electronic circuits 100 to 103. In the electronic circuit 104, the configuration of the upstream part of the electronic circuit 100 is altered. The electronic circuit 104 includes N variable delay elements D'x (x=0, 1, 2, . . . , N−1) that can adjust the delay amount (time delay) instead of the N delay elements Dx (x=0, 1, 2, . . . , N−1). Also, each of the variable delay elements D'x is connected to a delay synchronization loop circuit 33. The delay synchronization loop circuit 33 transmits a signal (reference signal) serving as a reference of the delay amount to each of the variable delay elements D'x. Each of the variable delay elements D'x sets the delay amount corresponding to the reference signal. In general, it is known that the delay amount of the delay element fluctuates depending on a voltage, a temperature, or the process used during manufacture. When the electronic circuit 104 is used, the delay amounts of the N variable delay elements D'x can be set accurately to the desired values. Therefore, a constant sampling rate can be maintained during the sampling process. Also, the sampling rate can be changed depending on the type of the input signal, the circuit subject to measurement, and the measurement timing. It can be noted that the other components of the electronic circuit 104 are similar to the above electronic circuit 100.

Thus, in the electronic circuit, the plurality of first delay elements can be a plurality of variable delay elements (D'x). In this case, the electronic circuit can further include the first control circuit that decides the delay amounts of the plurality of variable delay elements. The aforementioned delay synchronization loop circuit 33 is an example of a first control circuit.

(Fifth Variation of Electronic Circuit)

Figure 11:
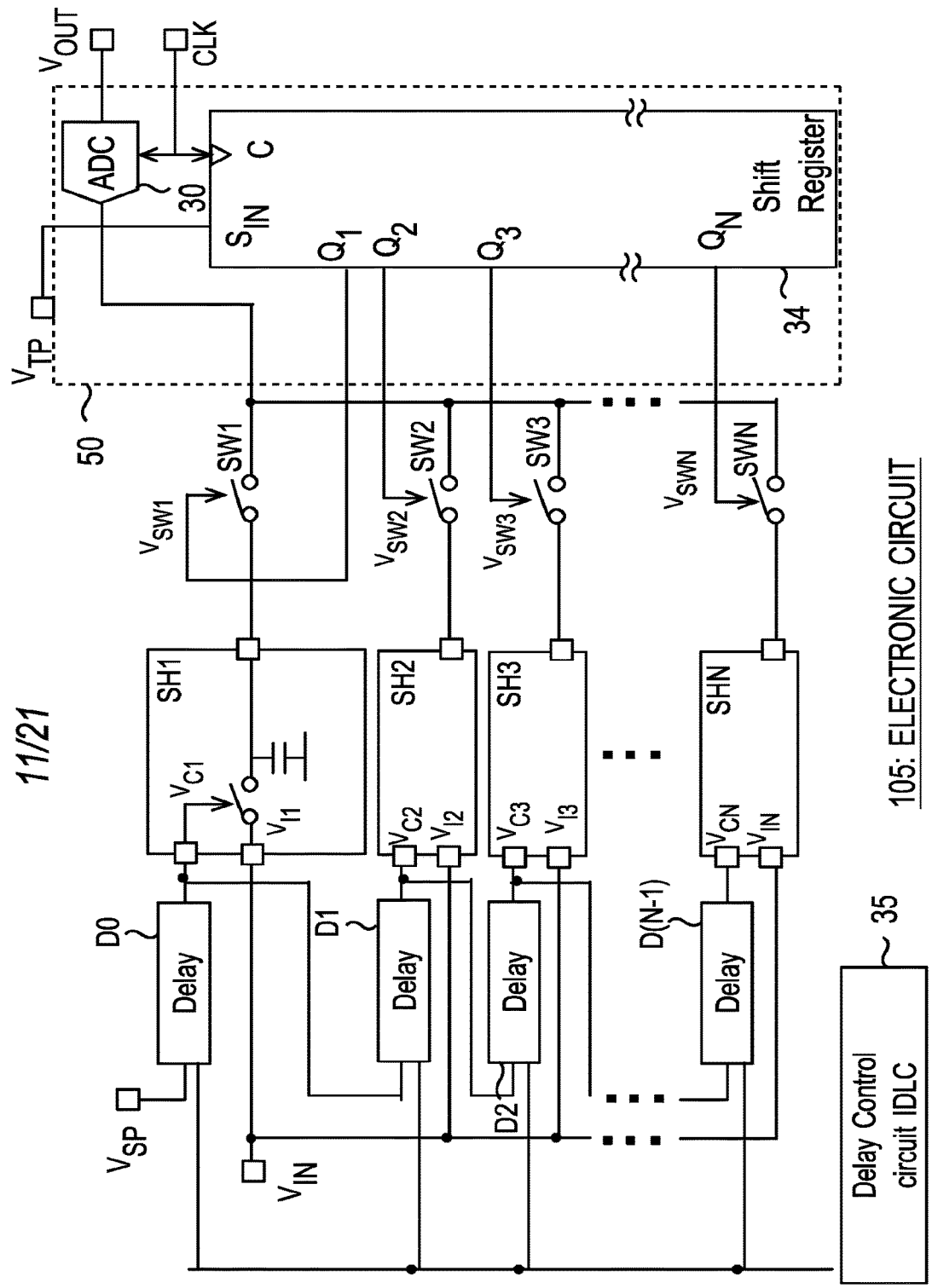
FIG. 11 is a diagram representing an electronic circuit according to a fifth variation.

FIG. 11 is a circuit diagram presenting an example of an electronic circuit 105. The electronic circuit 105 includes additional functions in addition to the functions of the above electronic circuits 100 to 103. In the electronic circuit 105, the configuration of the upstream part of the electronic circuit 100 is altered. The electronic circuit 105 includes the N variable delay elements D'x (x=0, 1, 2, . . . , N−1) that can adjust the delay amount (time delay) instead of the N delay elements Dx (x=0, 1, 2, . . . , N−1). Also, each of the variable delay elements D'x is connected to a delay control circuit 35. The delay control circuit 35 changes the delay amount of each of the variable delay elements D'x. Therefore, even if change of a signal (for example, a drain voltage or a drain current of the power device) is slow, the sampling rate is changed, and the part of the waveform subject to measurement (for example, the rise of the pulse or the like) can be sampled without omission. Also, the sampling rate that is adapted to a waveform of a measurement target can be used. It is noted that the other components of the electronic circuit 104 are similar to the above electronic circuit 100.

Thus, in the electronic circuit, the plurality of first delay elements can be a plurality of variable delay elements (D'x). In this case, the electronic circuit can further include the first control circuit that decides the delay amounts in the plurality of variable delay elements. The above delay control circuit 35 is an example of the first control circuit.

The control circuit can be configured to determine delay amounts of the first delay element and the second delay element which are variable delay elements.

(Sixth Variation of Electronic Circuit)

In the timing chart represented in FIG. 6 above, the fall edge of the pulse of the first pulse signal supplied to the logical terminal $V_{C1}$ of the sample-hold circuit SH1 is corresponds to the rise timing of the pulse of the signal input to the terminal $V_{IN}$ (input signal). Therefore, the electronic circuit can perform the analog-to-digital conversion by setting the rise timing of the pulse of the input signal as the sampling period $P_{samp}$. It can be noted however that in order to realize the above process, the pulse needs to be supplied to the logical terminal $V_{C1}$ of the sample-hold circuit SH1 at the timing when the sampling is desired to be started. In the following, an example of the electronic circuit that can control the start timing of the sampling process will be described, mainly focusing on the difference with the electronic circuit 100.

Figure 12:
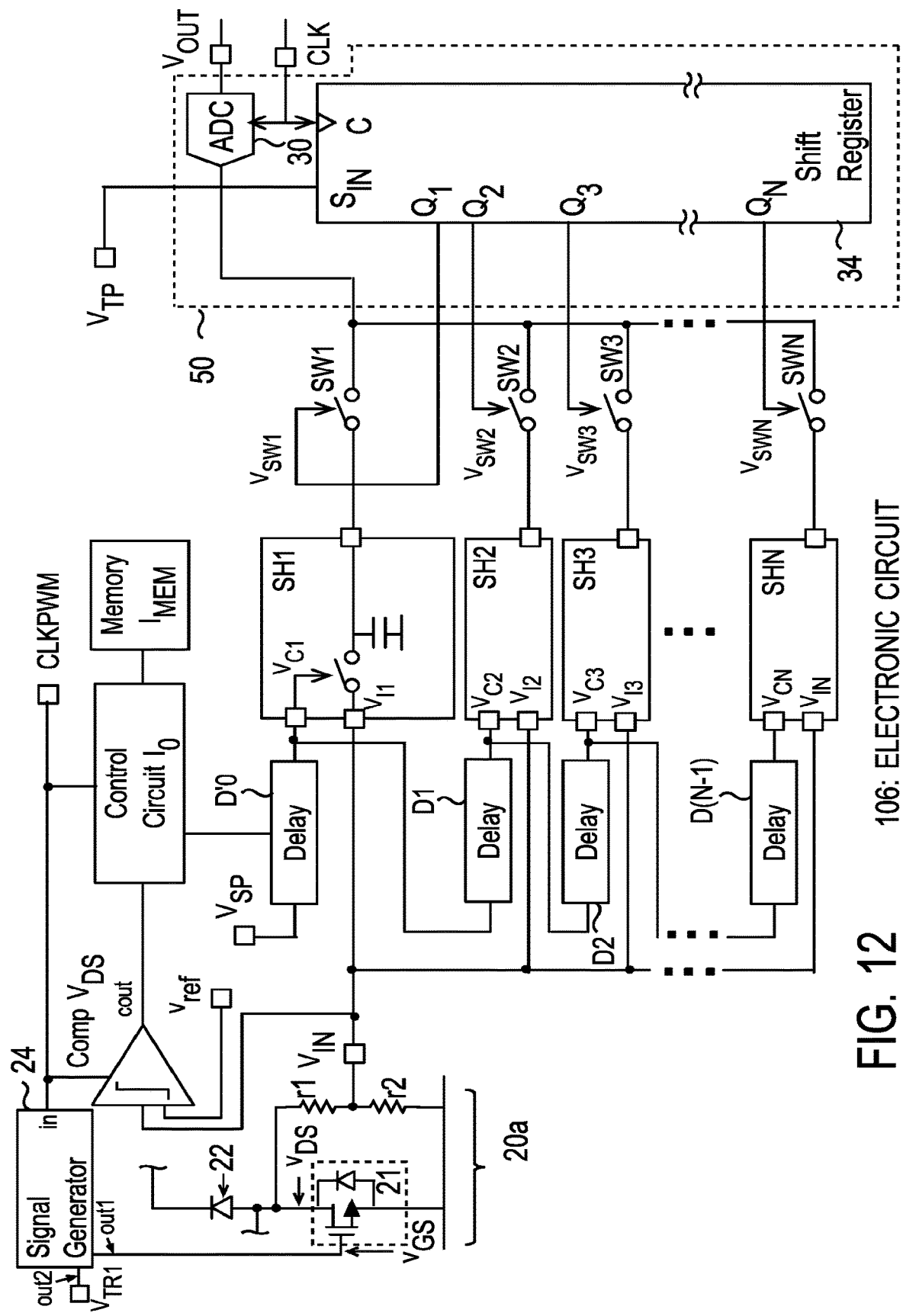
FIG. 12 is a diagram representing an electronic circuit according to a sixth variation.

FIG. 12 is a circuit diagram presenting an example of an electronic circuit 106. The electronic circuit 106 corresponds to an electronic circuit 100 with adding a function for controlling the start timing of the sampling process. The electronic circuit 106 includes a delay element D'0 that can adjust the delay amount (time delay) instead of the delay element D0. Also, the electronic circuit 106 further includes a comparator CompVDS, a control circuit $I_0$, and a memory $I_{MEM}$. The control circuit $I_0$ is connected to the delay element D'0. The control circuit $I_0$ is configured to change the delay amount at the delay element D'0. A first terminal of the comparator CompVDS is connected to the terminal $V_{IN}$ of the electronic circuit 106. Also, a second terminal of the comparator CompVDS is connected to a reference potential $v_{ref}$. A terminal cout of the comparator CompVDS is connected to the control circuit $I_0$. Then, the memory $I_{MEM}$ is connected to the control circuit $I_0$.

It can be noted that FIG. 12 includes not only the electronic circuit 106 but also a power circuit 20a. The power circuit 20a includes a signal generator 24 in addition to the components of the power circuit 20 in FIG. 1. The signal generator 24, the comparator CompVDS, and the control circuit $I_0$ are all connected to a terminal CLKPWM. Also, a terminal out1 of the signal generator 24 is connected to a gate terminal of the transistor 21. The clock signal is supplied to the terminal CLKPWM. The clock generator 11 in FIG. 1 can be connected to the terminal CLKPWM, or another clock generator can be connected to the terminal CLKPWM. The clock signal supplied to the terminal CLKPWM controls ON/OFF (conductive state/cut-off state) between the drain and the gate of the transistor 21. Also, the clock signal supplied to the terminal CLKPWM is supplied to the comparator CompVDS and the control circuit $I_0$.

It can be noted that as in the example of FIG. 12, the signal generator 24 can include two terminals. The signal supplied from the terminal out1 of the signal generator 24 controls a gate voltage $v_{GS}$ of the transistor 21. On the other hand, the terminal out2 of the signal generator 24 can be connected to the terminal $V_{TR}$ of the one-shot circuit 13 (see FIG. 1). The signal generator 24 supplies a pulse longer than the threshold th1 to the one-shot circuit 13 via the terminal out2. Thus, the pulse of the first pulse signal of the clock generator 11 is supplied to the terminal $V_{SP}$ via the one-shot circuit 13. The signal generator 24 can synchronize the timing when the level of the gate voltage $v_{GS}$ of the transistor 21 changes with the timing when the pulse approaches the terminal $V_{SP}$.

Figure 13:
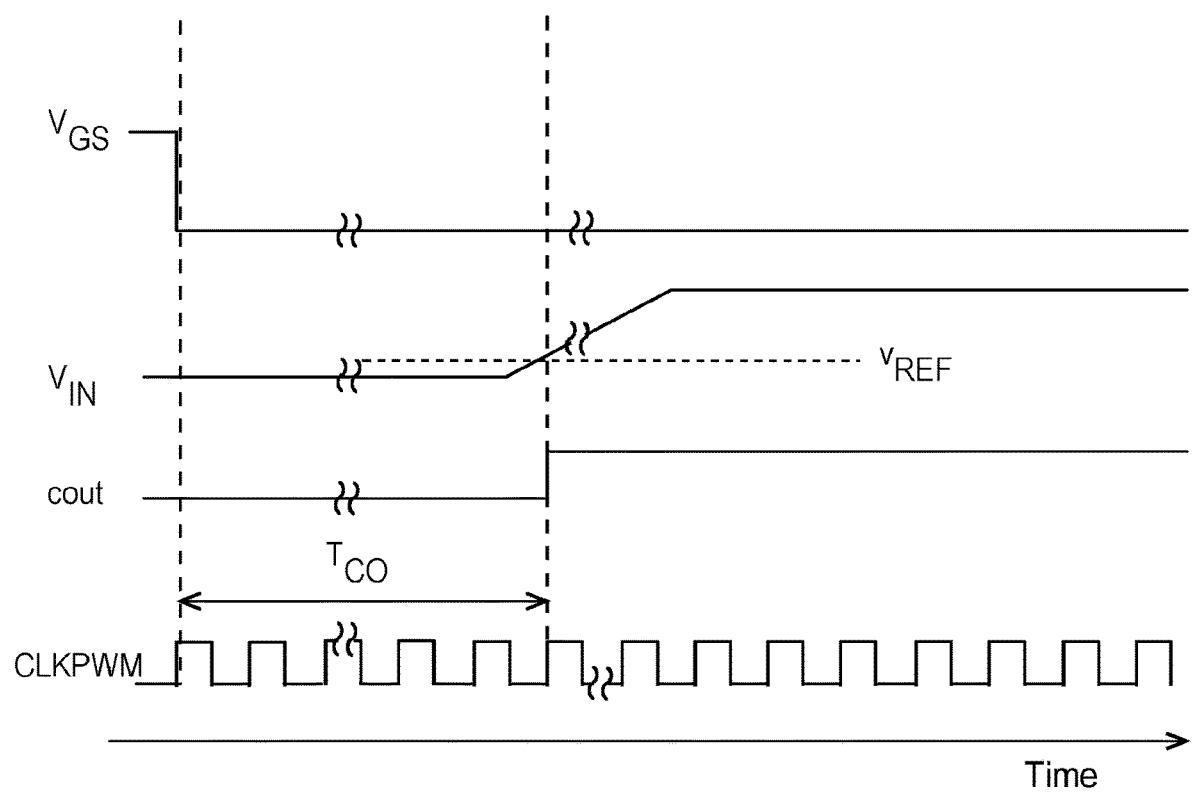
FIG. 13 is a timing chart representing an example of a signal waveform of the electronic circuit according to the sixth variation.

FIG. 13 is a timing chart presenting an example of the signal waveform in the electronic circuit 106. In the timing chart of FIG. 13, the gate voltage $v_{GS}$ of the transistor 21, a voltage at the terminal $V_{IN}$, a voltage at the terminal cout of the comparator, a voltage at the terminal CLKPWM are presented. The horizontal axis in FIG. 13 corresponds to the time. For example, in the circuit in FIG. 12 including the electronic circuit 106, a certain delay exists since the gate voltage $v_{GS}$ of the transistor 21 changes from HIGH to LOW until a drain voltage $v_{DS}$ changes from HIGH to LOW. If the gate voltage $v_{GS}$ of the transistor 21 also changes from LOW to HIGH, after a certain delay, the drain voltage $v_{DS}$ changes from LOW to HIGH. This delay may take different values depending on a condition such as the temperature or the process used during manufacture. When the level of the voltage signal at the terminal $V_{IN}$ becomes higher than the reference voltage $v_{ref}$, the comparator CompVDS supplies the HIGH signal from the terminal cout. The control circuit $I_0$ measures a time $T_{CO}$ elapsed since the gate voltage $v_{GS}$ of the transistor 21 changes from HIGH to LOW until the voltage level at the terminal cout of the comparator changes to HIGH based on the signal supplied from the terminal CLKPWM and the signal supplied from the comparator CompVDS. Here, the control circuit $I_0$ can save the measured time $T_{CO}$ in the memory $I_{MEM}$.

The control circuit $I_0$ can set the delay amount (time delay) at the variable delay element D'0 based on the value of the time $T_{CO}$ saved in the memory $I_{MEM}$. For example, the control circuit $I_0$ can set the delay amount of the variable delay element D'0 so that the timing of the rise of the pulse in the voltage signal at a terminal $V_{IO}$ (or the terminal $V_{IN}$) in the sample-hold circuit SH1 corresponds to the timing of the fall of the pulse in the voltage signal at the logical terminal $V_{C1}$ of the sample-hold circuit SH1. Also, the control circuit $I_0$ can set the delay amount of the variable delay element D'0 so that the fall of the pulse in the voltage signal at the logical terminal $V_{C1}$ of the sample-hold circuit SH1 occurs before the timing of the rise of the pulse in the voltage signal at the terminal $V_{I1}$ (or the terminal $V_{IN}$) of the sample-hold circuit SH1. Thus, it becomes possible to sample the rise period of the pulse of the voltage signal at the terminal $V_{IN}$, accurately. Also, if the reference voltage $v_{ref}$ of the comparator CompVDS and the logic in the control circuit $I_0$ are changed, sampling of the falling period of the pulse in the voltage signal at the terminal $V_{IN}$ can also be executed.

Thus, the electronic circuit can further include a semiconductor device can provide the input signal, a signal generator (signal generator 24) can generate a fifth signal to change the applied voltage of the semiconductor device, a comparator CompVDS configured to compare the input signal and a reference potential, and a control circuit $I_0$ connected to the signal generator and the comparator CompVDS. The first delay elements can be variable delay elements. The control circuit $I_0$ can determine a delay amount in the variable delay element based on a time difference between when the signal generator changed the applied voltage and when an output voltage of the comparator CompVDS changes. Here, for example, the power device such as the FET can be used as the semiconductor device. It can be noted however that any type of the semiconductor device can be used. It can be also noted that the configuration of the other parts of the electronic circuit 106 is similar to the above electronic circuit 100.

(Seventh Variation of Electronic Circuit)

The above electronic circuits 100 to 106 include the comparator CMPy that compares the reference voltage with the sampling voltage or the analog-to-digital converter 30 that generates the digital signal by quantizing the sampling voltage. The voltage fluctuation of a circuit surrounding the electronic circuit (for example, a voltage circuit) propagates due to a parasitic capacitance of the circuit, and there is a possibility that an erroneous operation of the comparator CMPy or the analog-to-digital converter 30 may be caused. Therefore, if the circuit subject to measurement includes a power device, the sampling voltage of the sample-hold circuit SH1 can be transferred to the comparator CMPy or the analog-to-digital converter 30 with a time delay from the edge of the pulse of the driving signal for the power device (for example, the signal supplied to the gate terminal of the transistor 21) thereby reducing the effect from noises. Here, the edge of the pulse includes both the rising edge and the falling edge. While the supply of the pulse in the voltage signal to the terminal $V_{TP}$ is used as a trigger, the sampling voltage of the sample-hold circuit SH1 is transferred to the comparator CMPy or the analog-to-digital converter 30.

Figure 14:
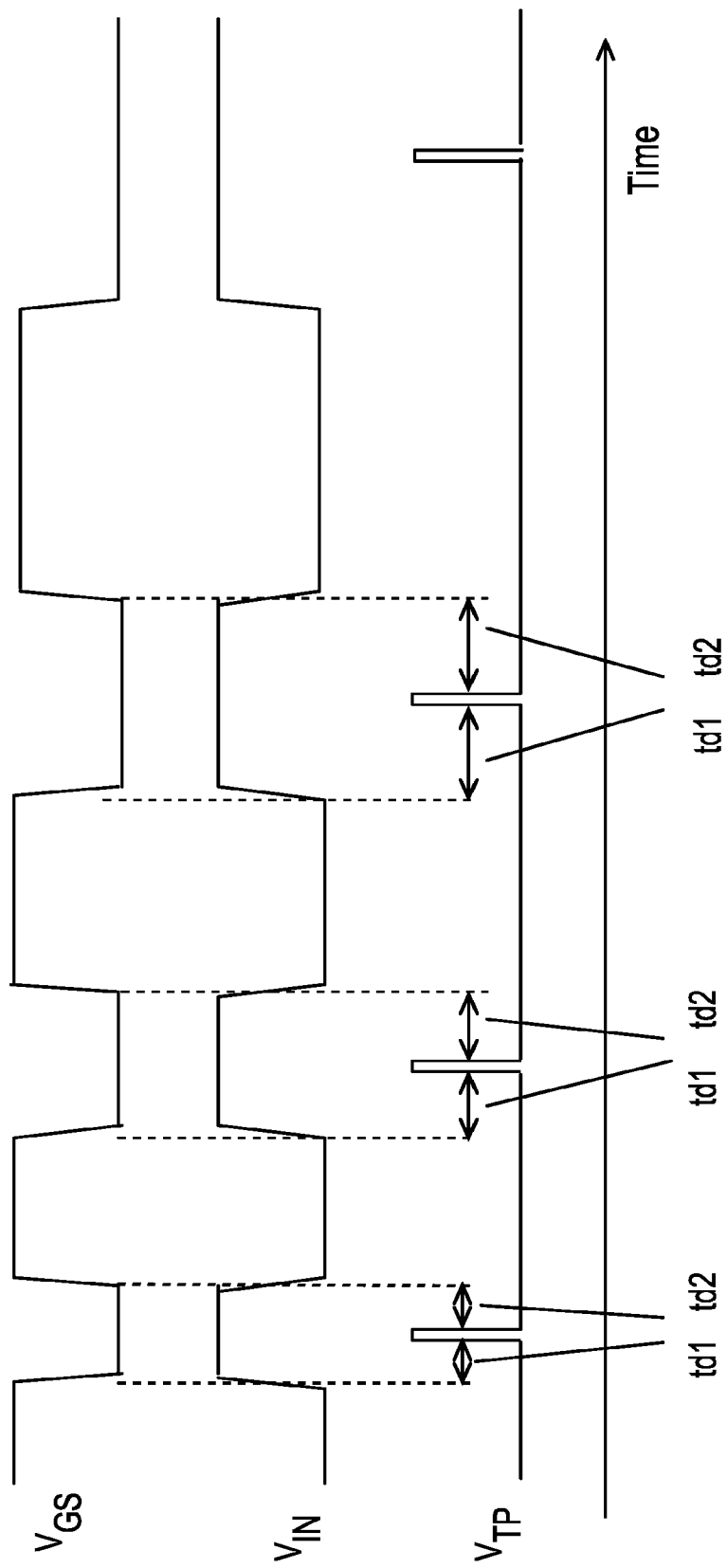
FIG. 14 is a diagram representing an example of an execution timing of a quantization process.
Figure 15:
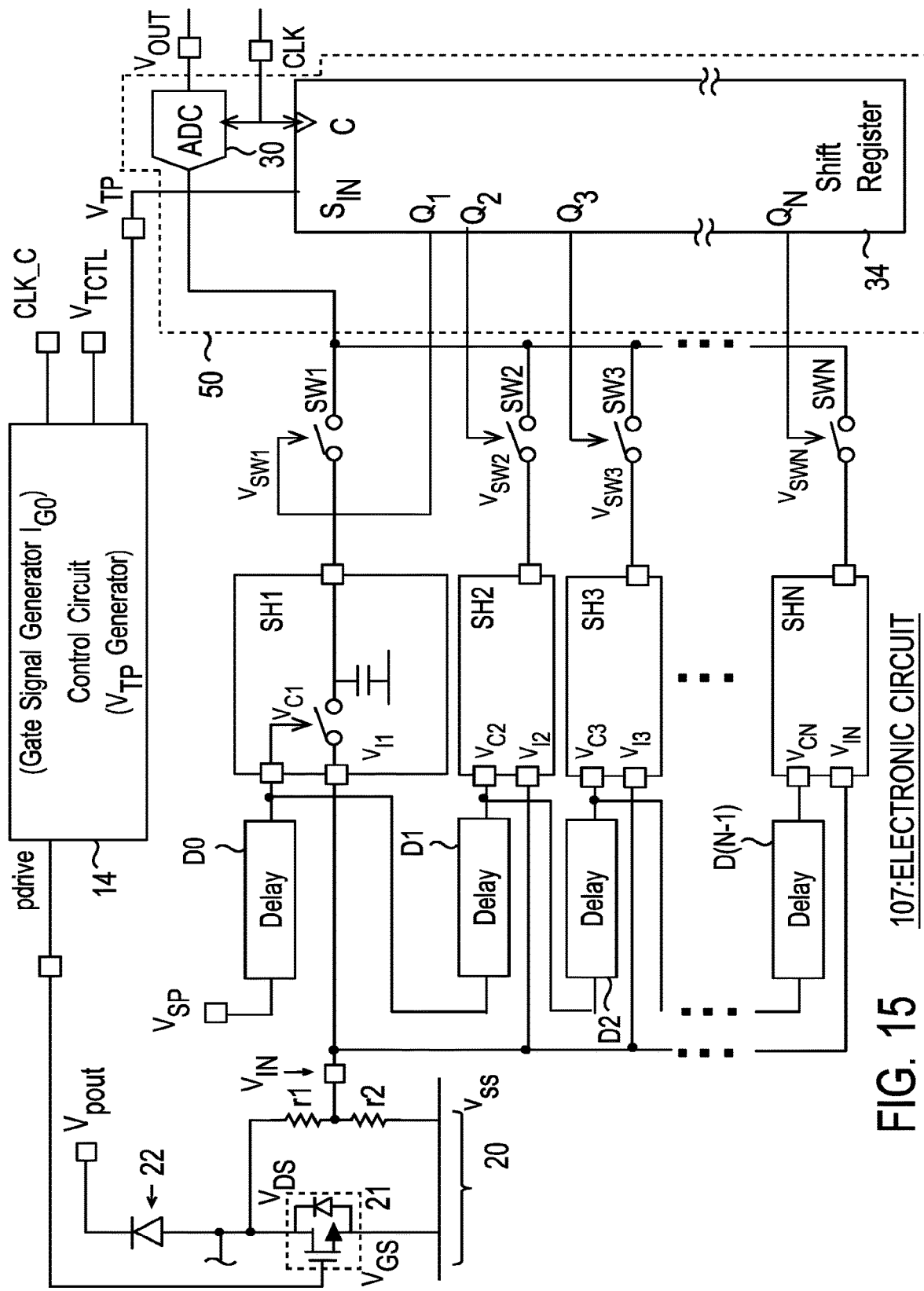
FIG. 15 is a diagram representing an electronic circuit according to a seventh variation.

For example, as presented in the time chart in FIG. 14, the pulse of the voltage signal can be supplied to the terminal $V_{TP}$ at an intermediate timing between the falling edge and the rising edge of the pulse in the gate voltage $v_{Gs}$ of the transistor 21. It can be noted that if the difference between the timing when the pulse of the voltage signal is supplied to the terminal $V_{TP}$ and the timing corresponding to the falling edge of the pulse in the gate voltage $v_{GS}$ of the transistor 21 is set to $t_{d1}$, and the difference between the timing corresponding to the rising edge of the pulse in the gate voltage $v_{GS}$ of the transistor 21 and the timing when the pulse of the voltage signal is supplied to the terminal $V_{TP}$ is set as $t_{d2}$, $t_{d1}$ and $t_{d2}$ can be set to equal values. If the difference between $t_{d1}$ and $t_{d2}$ is set to smaller values, the influence from the noise during the quantization process can be reduced. FIG. 15 is a circuit diagram presenting an example of an electronic circuit 107. The control circuit 14 includes a terminal pdrive, the terminal $V_{TP}$, a terminal CLK_C, and a terminal $V_{TCTL}$. The terminal pdrive is connected to the gate terminal of the transistor 21. The control circuit 14 controls the gate voltage $v_{gs}$ of the transistor 21 via the terminal pdrive. The terminal CLK_C is connected to a clock generator (not illustrated), for example. The control circuit 14 can be driven by the clock signal supplied from the terminal CLK_C. For example, a signal for specifying a timing when the pulse of the voltage signal is generated at the terminal $V_{TP}$ is supplied to the terminal $V_{TCTL}$. The control circuit 14 can supply the voltage signal from the terminal pdrive and the terminal $V_{TP}$ based on the signal supplied from the terminal $V_{TCTL}$. Also, regardless of the signal supplied from the terminal $V_{TCTL}$, the voltage signals can be supplied from the terminal pdrive and the terminal $V_{TP}$. The voltage signal (second pulse signal) including the pulse for specifying the transfer timing of the sampling voltage to the analog-to-digital converter 30 is supplied from the terminal $V_{TP}$. According to the configuration of FIG. 15, since the same control circuit 14 controls the gate voltage $v_{gs}$ of the transistor 21 and the voltage signal of the terminal $V_{TP}$, the quantization process can be performed with a time delay from the edge of the driving signal of the power device, as illustrated in the timing chart of FIG. 14.

Thus, the electronic circuit can further include a semiconductor device and a control circuit 14. The semiconductor device can provide the input signal. The control circuit 14 is connected to the semiconductor device and the shift register. The control circuit 14 can determine an applied voltage of the semiconductor device, can determine a first timing when the shift register provides the third pulse signal and can determine a second timing when the shift register provides the fourth signal. Here, for example, the power device such as the FET can be used as the semiconductor device. It can noted that any type of the semiconductor device can be used. The control circuit 14 can be configured so that the pulse output to the serial terminal is inhibited during a period when the input voltage of the power device is changed. Here, an example of the change in the input voltage of the power device includes the change in the voltage corresponding to the rising period of the pulse of the voltage signal at the gate terminal and the rising period of the pulse. In the example of the electronic circuit 107 in FIG. 15, the power device is a FET, and the output terminal of the power device corresponds to the drain terminal of the FET. It can be noted however that any type of the power device to which the second terminal is connected and any terminal of the power device can be used. It can be noted that the other components of the electronic circuit 107 are similar to those of the electronic circuit 100.

(Eighth Variation of Electronic Circuit)

Fluctuation of voltage may occur in the power device due to parasitic capacitance and parasitic inductance, for some cases. This voltage fluctuation is also referred to as ringing. Ringing appears in the output waveform of the power device during switching, for example. If the power device is a transistor, ringing appears as a noise including high frequency components in the vicinity of the rising edge and/or the falling edge of the voltage waveform. Hereinafter, an example of the electronic circuit in which the effects from the ringing is reduced, and the analog-to-digital conversion process is executed with high accuracy will be described.

Figure 16:
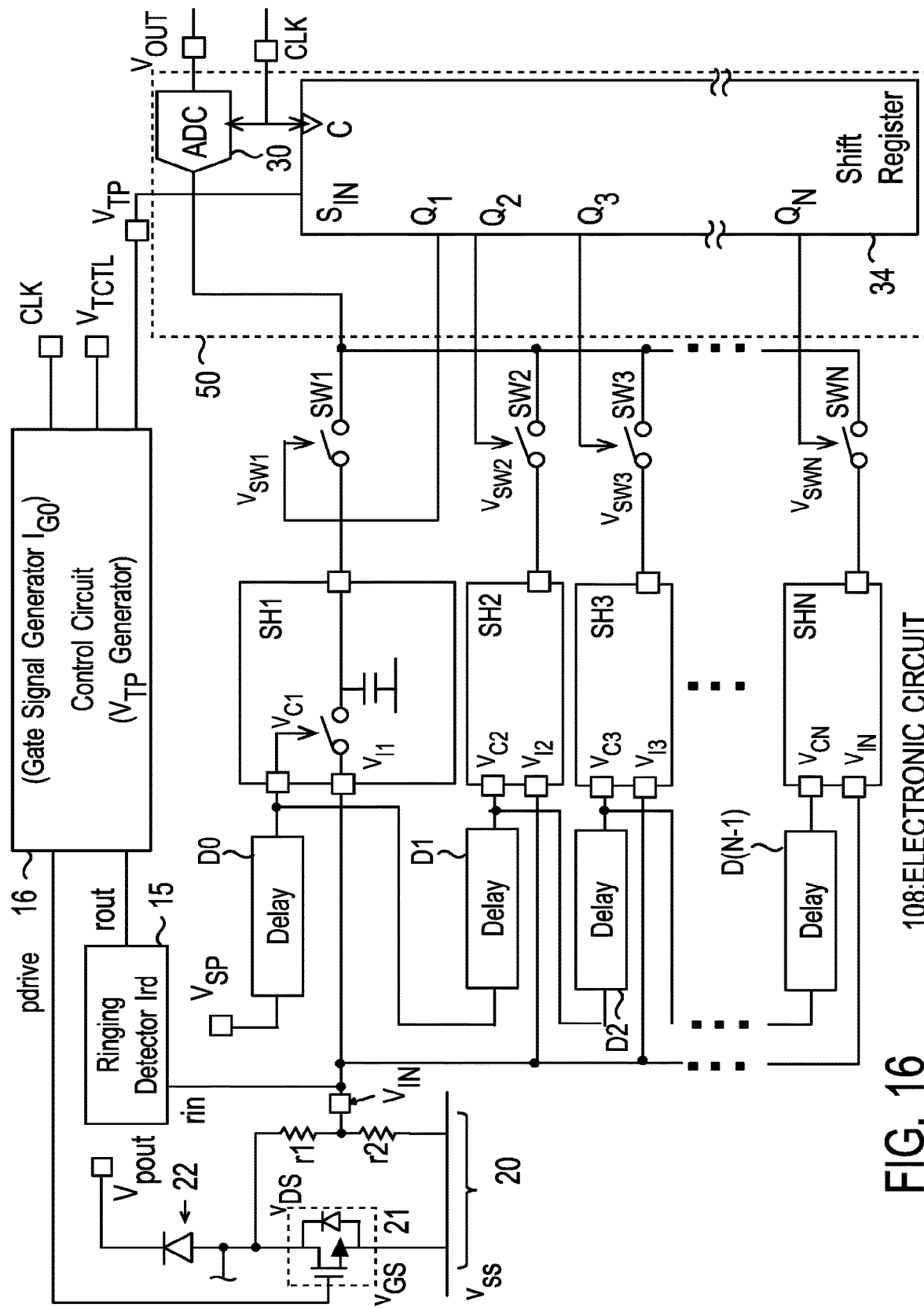
FIG. 16 is a diagram representing an electronic circuit according to an eighth variation.

FIG. 16 is a circuit diagram presenting an example of an electronic circuit 108. The electronic circuit 108 corresponds to the electronic circuit 107 with a ringing detection circuit 15. Also, in the electronic circuit 108, the control circuit 14 is replaced with a control circuit 16. A terminal rin of the ringing detection circuit 15 is connected to the terminal $V_{IN}$. Also, a terminal rout of the ringing detection circuit 15 is connected to the control circuit 16. The ringing detection circuit 15 monitors the voltage signal at the terminal $V_{IN}$ and determines ringing is occurring or not.

Figure 17:
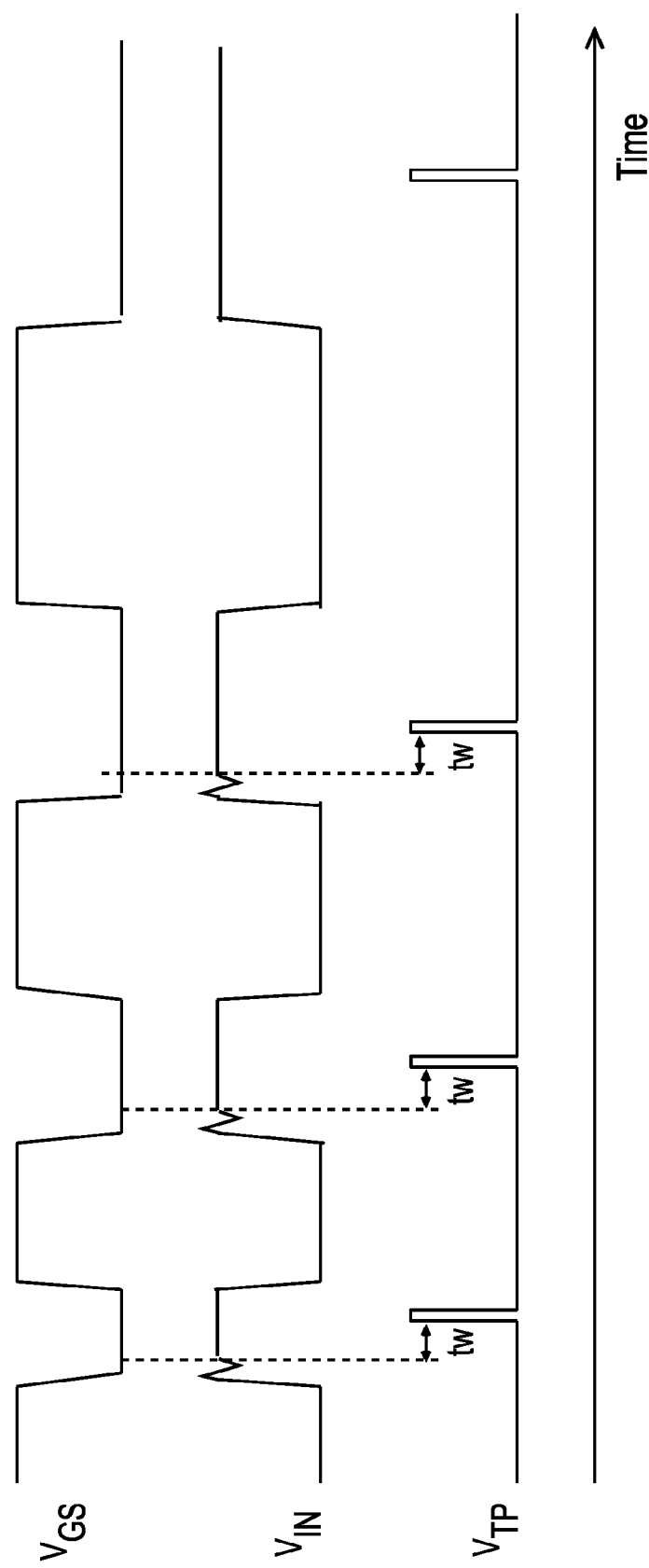
FIG. 17 is a diagram presenting an example of an execution timing of the quantization process.

If ringing is detected, the ringing detection circuit 15 notifies the generation of the ringing to the control circuit 16. Also, the ringing detection circuit 15 may notify the state when the ringing is not detected or the state when the amplitude of the noise component becomes lower than the threshold due to the ringing to the control circuit 16. The monitoring of the ringing and the notification to the control circuit 16 by the ringing detection circuit 15 can be performed periodically. The control circuit 16 also includes a function for stopping the supply of pulses to the terminal $V_{TP}$ when the notification indicating that the ringing occurs is received, besides the functions of the control circuit 14. When the control circuit 16 receives the notification indicating that the ringing is not detected or the notification indicating that the amplitude of the noise component due to the ringing becomes lower than the threshold, the pulse of the voltage signal (second pulse signal) can be supplied from the terminal $V_{TP}$. As illustrated in the time chart in FIG. 17, when a period th elapses since the control circuit 16 receives the notification indicating that the ringing is not detected or the notification indicating that the amplitude of the noise component due to the ringing becomes lower than the threshold, the pulse of the voltage signal (second pulse signal) can be supplied from the terminal $V_{TP}$.

Therefore, the electronic circuit can include the detection circuit (for example, the above ringing detection circuit 15) that can detect the ringing in the applied voltage. In this case, the control circuit 14 can further determine the first timing and the second timing based on a notification regarding the detected ringing transmitted from the detection circuit. The control circuit 14 can be configured so that pulse supply to a serial terminal (terminal $S_{IN}$) of the shift register is stopped in the period when the ringing detection circuit detects occurrence of ringing.

When the electronic circuit 108 is used, effects of ringing during the analog-to-digital conversion process can be reduced. It can be noted that other components of the electronic circuit 108 are similar to the electronic circuit 107. The electronic circuit 107 and the electronic circuit 108 can be used for cases when the analog-to-digital conversion during the rising period of the pulse of the voltage signal input to the terminal $V_{IN}$ is executed and when the analog-to-digital conversion in the falling period of the pulse of the voltage signal input to the terminal $V_{IN}$ is executed.

(Ninth Variation of Electronic Circuit)

Figure 18:
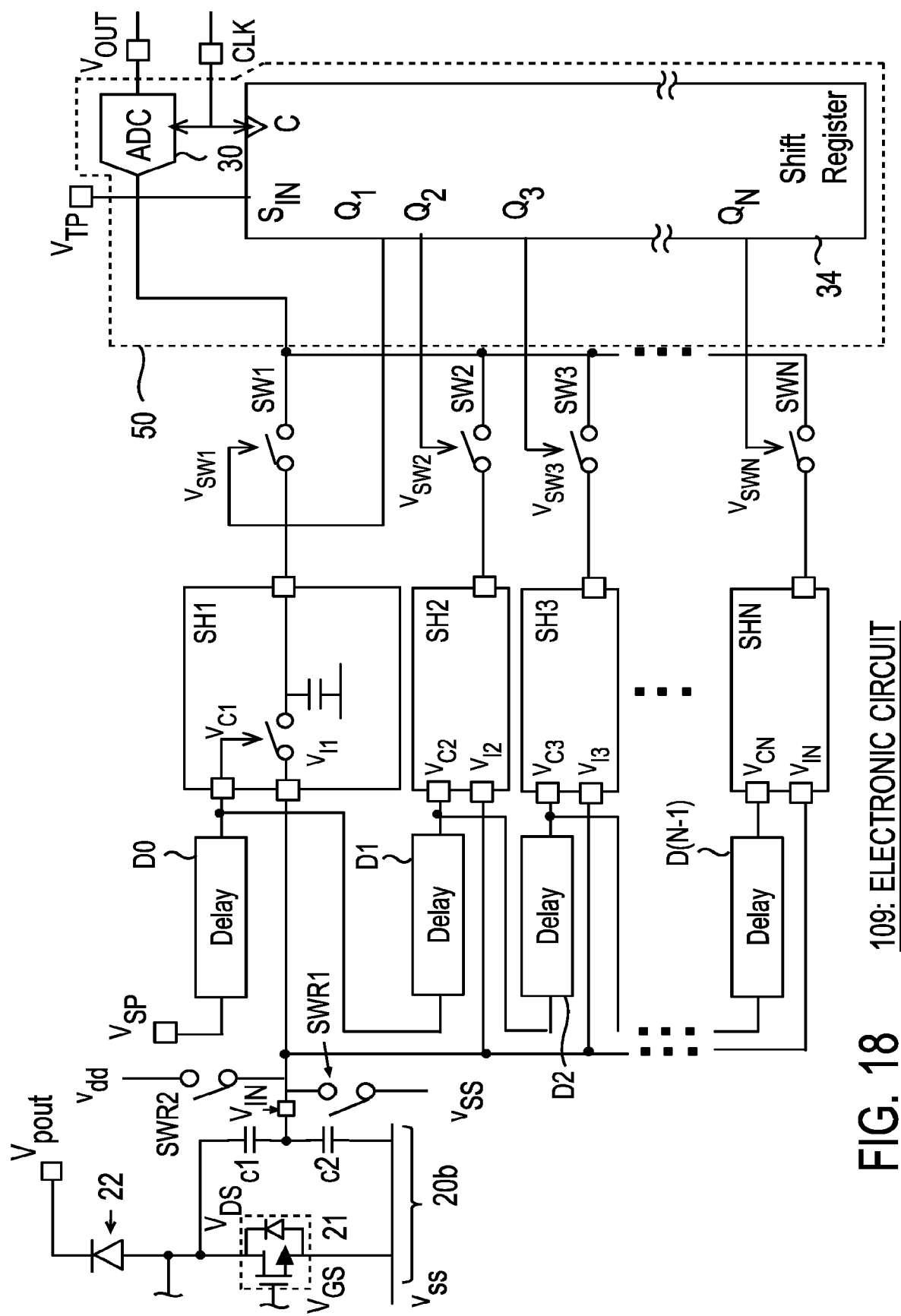
FIG. 18 is a diagram presenting an electronic circuit according to a ninth variation.

FIG. 18 is a circuit diagram presenting an example of an electronic circuit 109. The electronic circuit 109 corresponds to the electronic circuit 100 with a switch SWR1 and a switch SWR2. In the electronic circuit 109, the switch SWR2 is connected between the power supply potential $v_{dd}$ and the terminal $V_{IN}$. Also, the switch SWR1 is connected between the terminal $V_{IN}$ and the ground $v_{ss}$. It can be noted that FIG. 18 illustrates both the electronic circuit 109 and the power circuit 20b. The power circuit 20b is a circuit obtained by replacing the resistors r1 and r2 of the power circuit 20 with capacitances c1 and c2, respectively. As presented in the power circuit 20b, a configuration where the output voltage of the power device (for example, the drain voltage of the transistor 21) is divided by capacitance and then connected to the terminal $V_{IN}$ can be adopted. It can be noted that according to the above configuration, before the analog-to-digital conversion is executed, the voltage level at the terminal $V_{IN}$ needs to be reset so that the signal to be measured is not affected by the signal which has been input previously to the terminal $V_{IN}$. Therefore, in the electronic circuit 109, the switches SWR1 and SWR2 are turned ON, and the voltage level at the terminal $V_{IN}$ is reset. The switches SWR1 and SWR2 can be controlled by the above control circuit 14 or 16 (not illustrated), for example. Thus, the analog-to-digital conversion can be executed accurately even if the output voltage of the power device is subject to the division of voltage by capacitance.

Thus, the electronic circuit can further include a semiconductor device can provide the input signal, an input terminal where the signal is input, a capacitor c1 connected between the semiconductor device and the input terminal, a capacitor c2 connected between the capacitor c1 and the ground, a switch SWR2 connected between the power supply potential and the terminal $V_{IN}$, and a switch SWR1 connected between the input terminal and the ground. Here, for example, the power device such as the FET can be used as the semiconductor device. It can be noted however that any type of the semiconductor device can be used. In FIG. 18, the power device is the FET, and the output of the power device is the drain terminal of the FET. However, any type of power device can be used. Also, any terminal can be used as the output terminal.

(Tenth Variation of Electronic Circuit)

In above, variations of electronic circuits were explained while cases when the analog-to-digital conversion of the voltage signal in the drain terminal of the transistor is mainly performed were discussed as an example. However, it can be noted that the signal subject to analog-to-digital conversion in the electronic circuit is not limited to the examples discussed above. The terminal $V_{IN}$ of the electronic circuit can be connected to a terminal other than the drain terminal of the transistor. The electronic circuit can perform the analog-to-digital conversion of the signal output from the other power device. For example, as it is described below, the electronic circuit can measure a current signal and perform the analog-to-digital conversion based on the measured value with respect to the voltage signal.

Figure 19:
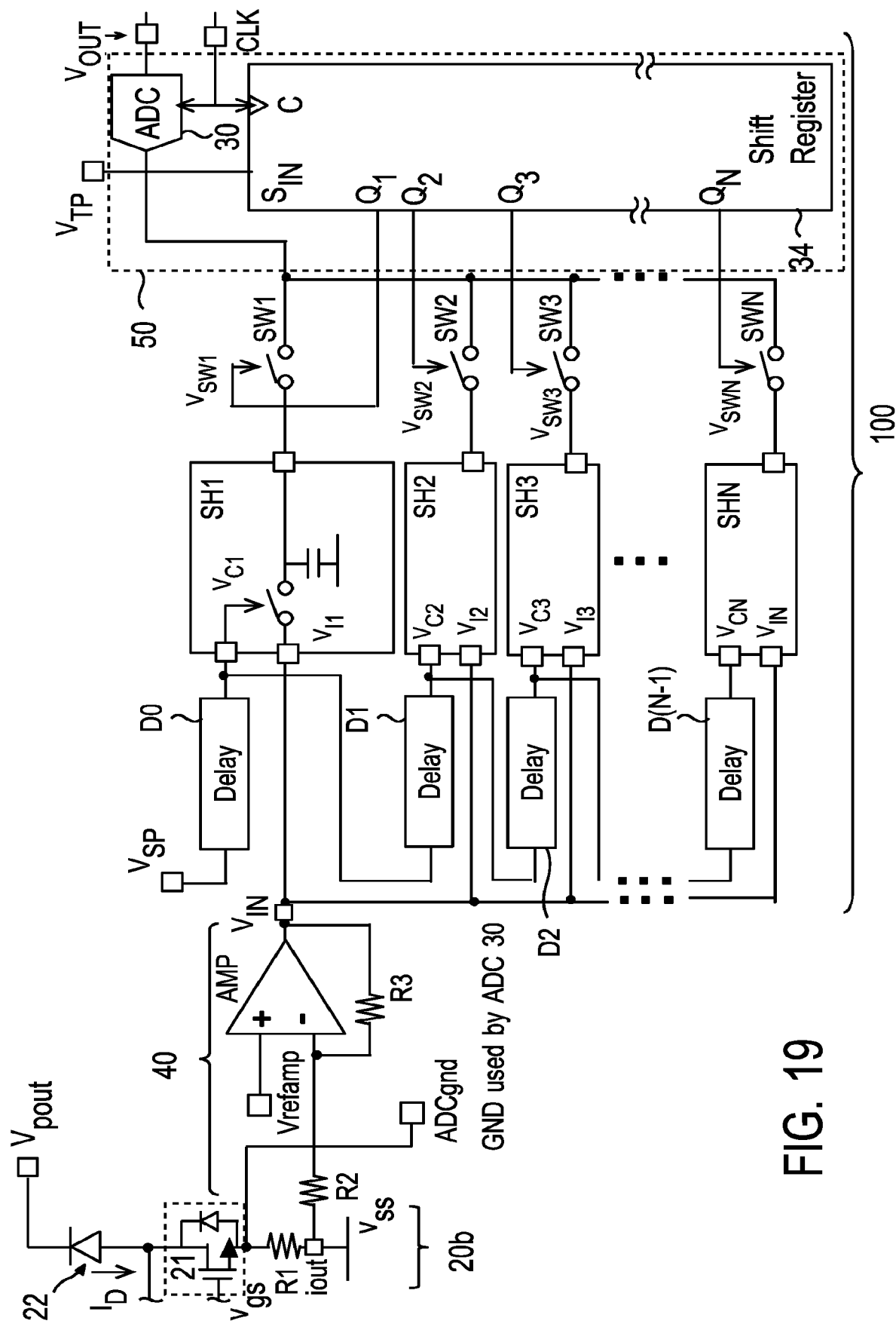
FIG. 19 is a diagram presenting an electronic circuit according to a tenth variation.

FIG. 19 is a circuit diagram presenting an example of a configuration in which the electronic circuit 100 is connected to the power circuit 20b via an amplification circuit 40. In FIG. 19, the power circuit 20b, the amplification circuit 40, and the electronic circuit 100 are implemented from the input side of the circuit to the output side. The power circuit 20b includes the transistor (field effect transistor) 21, the diode 22, the inductor 23, and a resistor R1. The diode 22 and the inductor 23 are connected in parallel between the power supply potential $v_{dd}$ and the drain terminal of the transistor 21. The resistor R1 is connected between the source terminal of the transistor 21 and the ground $v_{ss}$. Also, the terminal ADCgnd is connected to the source terminal of the transistor 21. The terminal ADCgnd is connected to the reference potential of the ADC 30. Thus, a reference potential of the driver chip the ADC 30 is mounted can be a potential at a source terminal of the power device. In the power circuit 20b, a current $I_D$ flows between the gate and the source according to the voltage $v_{gs}$ applied to the gate terminal of the transistor. The current ID during the rising period of the pulse, and the current $I_D$ decreases during the falling period of the pulse. The voltage drop (negative voltage) occurs from the power supply $v_{dd}$ side towards the ground $v_{ss}$ side due to the current $I_D$ flowing the resistor R1.

Also, the resistor R2 of the amplification circuit 40 is connected to the terminal iout between the resistor R1 and the ground $v_{ss}$. The amplification circuit 40 includes an amplifier AMP, the resistor R2, and a resistor R3. For example, the amplifier AMP can be an operation amplifier. The resistor R2 is connected between the terminal iout (ground vss) and a negative terminal of the amplifier AMP. The resistor R3 can be connected between the negative terminal of the amplifier AMP and the terminal $V_{IN}$. The terminal Vrefamp is connected to a positive terminal of the amplifier AMP. The reference potential of the amplifier AMP is applied to the terminal Vrefamp. Then, the downstream side of the amplifier AMP is connected to the input terminal $V_{IN}$ of the electronic circuit 100. Therefore, the amplification circuit 40 can operate as an inverting amplification circuit, and can convert the current signal $I_D$ of the power circuit 20b into a positive voltage to be input to the input terminal $V_{IN}$ of the electronic circuit 100. While the positive voltage signal after the conversion is set as an input, the electronic circuit 100 can perform the analog-to-digital conversion.

Thus, the electronic circuit can further include a semiconductor device, a resistor R1 connected to the semiconductor device and the ground, a resistor R2 connected to the resistor R1, a amplifier AMP connected to the resistor R2 and the reference potential and to provide the input signal, and a resistor R3 connecting a node between the resistor R2 and the amplifier AMP with a node between the amplifier AMP and the input terminal (terminal V). Here, for example, the power device such as the FET can be used as the semiconductor device. It is noted however that any type of the semiconductor device can be used. In the example of FIG. 19, the power device is the FET, and the source of the FET is used as the output of the power device. However, any type of the power device and any terminal in the power device can be used.

(Example of Comparator Used in Electronic Circuit)

In the above descriptions, the electronic circuits 100 to 109 including the comparator or the analog-to-digital converter have been explained. Even if the comparator is not illustrated explicitly in the circuit diagrams of the aforementioned electronic circuits 100 to 109, the comparator may be included in some cases as an element within the circuit corresponding to the analog-to-digital converter. Hereinafter, an example of the comparator which can be used in the aforementioned electronic circuits 100 to 109 can be described.

Figure 20:
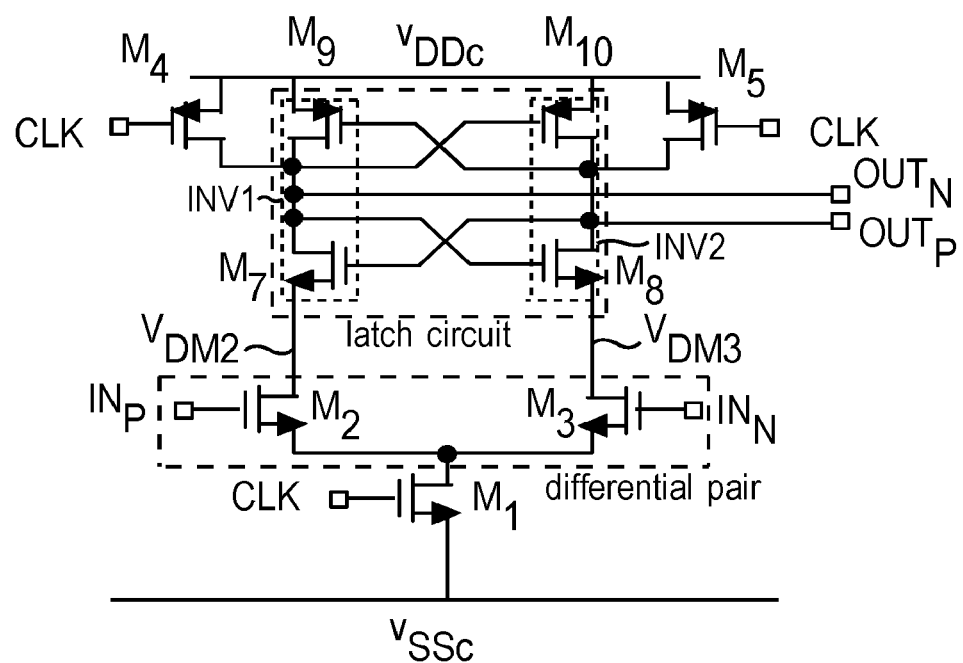
FIG. 20 is a circuit diagram of a comparator.

FIG. 20 is a circuit diagram presenting an example of a comparator 36. The comparator 36 includes five NMOS transistors and four PMOS transistors. The transistor $M_1$, the transistor $M_2$, the transistor $M_3$, the transistor $M_7$, and the transistor $M_8$ in the comparator 36 are NMOS transistors. On the other hand, the transistor $M_4$, the transistor $M_5$, the transistor $M_9$, and the transistor $M_{10}$ of the comparator 36 are PMOS transistors.

A source terminal of the transistor $M_1$ is connected to a reference potential (ground) $v_{SSc}$ of the comparator 36. The transistor $M_1$ is a switch that turns the comparator 36 ON/OFF according to the clock signal supplied to the gate terminal. The source terminal of the transistor $M_2$ and the source terminal of the transistor $M_3$ are both connected to the drain terminal of the transistor $M_1$. The transistor $M_2$ and the transistor $M_3$ form a differential pair that compares a voltage applied to a terminal $IN_N$ with a voltage applied to a terminal $IN_P$.

The source terminal of the transistor $M_9$ and the source terminal of the transistor $M_{10}$ are both connected to a power supply potential $V_{DDc}$ of the comparator 36. Also, the drain terminal of the transistor $M_9$ is connected to the drain terminal of the transistor $M_7$. The drain terminal of the transistor $M_{10}$ is connected to the drain terminal of the transistor $M_8$. The source terminal of the transistor $M_7$ is connected to the drain terminal of the transistor $M_2$. The source terminal of the transistor $M_8$ is connected to the drain terminal of the transistor $M_3$. Thus, the transistor $M_7$ and the transistor $M_9$ form a CMOS inverter INV1. On the other hand, the transistor $M_8$ and the transistor $M_{10}$ form a CMOS inverter INV2. Here, the CMOS inverter INV1 is connected between the power supply potential $V_{DDc}$ of the comparator 36 and the drain terminal of the transistor $M_2$. On the other hand, the CMOS inverter INV2 is connected between the power supply potential $V_{DDc}$ of the comparator 36 and the drain terminal of the transistor $M_3$.

The gate terminal of the transistor $M_9$ and the gate terminal of the transistor $M_7$ (both corresponding to the input side of the CMOS inverter INV1 are both connected to a point between the drain terminal of the transistor $M_8$ and the drain terminal of the transistor $M_{10}$ (corresponding to the output side of the CMOS inverter INV2). The gate terminal of the transistor $M_{10}$ and the gate terminal of the transistor $M_8$ (both corresponding to the input side of the CMOS inverter INV2) are both connected to a point between the drain terminal of the transistor $M_9$ and the drain terminal of the transistor $M_7$ (corresponding to the input side of the CMOS inverter INV1. Thus, the input side of the CMOS inverter INV1 is connected to the output side of the CMOS inverter INV2. On the other hand, the input side of the CMOS inverter INV2 is connected to the output side of the CMOS inverter INV1. The input sides and the output sides of the CMOS inverter INV1 and the CMOS inverter INV2 are connected mutually forming a latch circuit.

Also, the transistor $M_4$ is connected between the drain terminal of the transistor $M_9$ and the power supply potential $V_{DDc}$ of the comparator 36. Here, the source terminal of the transistor $M_4$ is connected to the power supply potential $V_{DDc}$. Also, the drain terminal of the transistor $M_4$ is connected to the drain terminal of the transistor $M_9$. Furthermore, the transistor $M_5$ is connected between the drain terminal of the transistor $M_{10}$ and the power supply potential $V_{DDc}$ of the comparator 36. Here, the source terminal of the transistor $M_5$ is connected to the power supply potential $V_{DDc}$. Also, the drain terminal of the transistor $M_5$ is connected to the drain terminal of the transistor $M_9$. Each of the transistor $M_4$ and the transistor $M_5$ serves as a switch that turns ON/OFF according to the clock signal supplied to the gate terminal. Here, the same clock signal as the clock signal supplied to a gate terminal of the transistor $M_1$ can be used. Here, a comparator without the transistor $M_4$ and the transistor $M_5$ can be used.

The terminal $OUT_N$ of the comparator 36 is connected between the drain terminal of the transistor $M_9$ and the drain terminal of the transistor $M_7$. Also, the terminal $OUT_P$ of the comparator 36 is connected between the drain terminal of the transistor $M_{10}$ and the drain terminal of the transistor $M_8$. A current depending on the difference between applied voltages $IN_N$ and $IN_P$ flows through the output side of the CMOS inverter INV1 and the output side of the CMOS inverter INV2 in the latch circuit. Thus, the latch circuit operates, and the voltage $OUT_P$ and the voltage $OUT_N$ become HIGH or LOW voltages depending on the comparison result of the voltage applied to the terminal $IN_N$ and the voltage applied to the terminal $IN_P$.

During the operation of the latch circuit, the drain voltage of $v_{DM2}$ of the transistor $M_2$ and the drain voltage of $v_{DM3}$ of the transistor $M_3$ fluctuate between the power supply voltage $v_{DDc}$ and the ground voltage $v_{SSc}$. Due to a parasitic capacitance $c_{gs}$ between the gate and drain of the transistor $M_2$ and the transistor $M_3$, the voltage levels of the terminal $IN_P$ and the terminal $IN_N$ are also affected by the voltage fluctuation. This phenomenon is referred to as a kickback, causing errors during the operation of the comparator 36.

Figure 21:
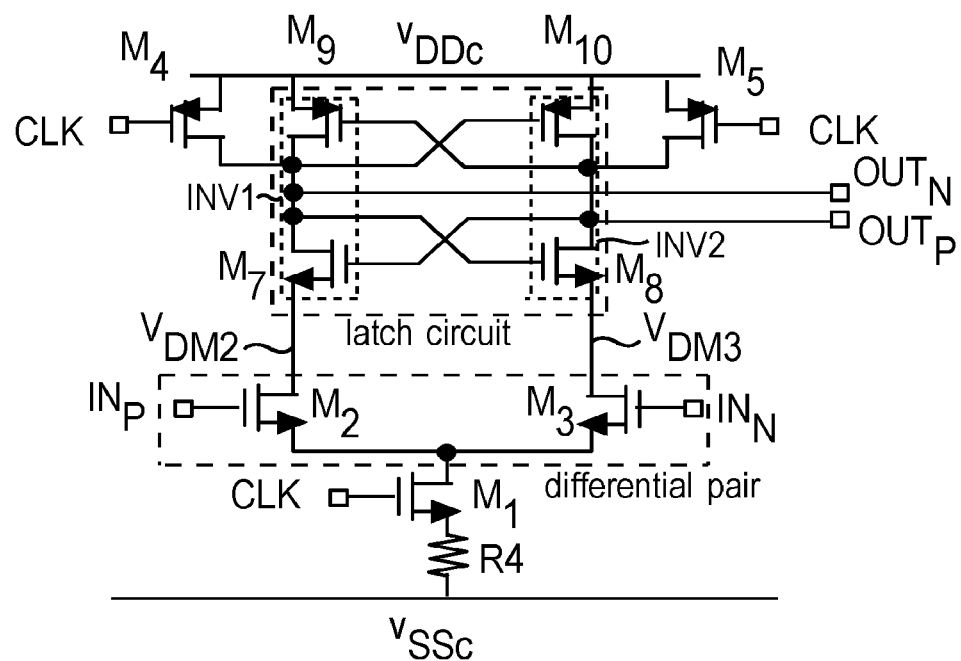
FIG. 21 is a circuit diagram of a comparator.

Therefore, as illustrated in the comparator 37 of FIG. 21, a resister R4 can be connected between the source terminal of the transistor $M_1$ and the reference potential $v_{SSc}$. The configuration of the other parts of the comparator 37 is similar to the aforementioned comparator 36. The resister R4 restricts a current flowing through the latch circuit when the transistor $M_1$ turns ON. For this reason, occurrence of an abrupt voltage fluctuation in the drain voltage $v_{DM2}$ of the transistor $M_2$ and the drain voltage $v_{DM3}$ of the transistor $M_3$ is avoided, and occurrence of the kickback can be prevented. Thus, the operation accuracy of the comparator can be improved.

Thus, with regard to the quantization circuit in the electronic circuit, the quantization circuit can include at least one comparator. For example, the comparator can include the latch circuit, the differential pair, the switch (transistor $M_1$), and the resister R4. The latch circuit can include a first inverter and a second inverter. The differential pair can drive the first inverter and the second inverter in the latch circuit by a current based on comparison of two voltages entered to the differential pair. The switch can switch an operation state of the differential pair. The resister R4 can be connected between the switch and the reference potential. The differential pair can be connected between the switch and the latch circuit. The latch circuit can be connected between the power supply potential and the differential pair. The input terminal of the first inverter can be connected to an output terminal. An output terminal of the first inverter can be connected to an input terminal.

By using the electronic circuits according to the above embodiments, analog-to-digital conversion of signal waveforms including radical changes become possible while the circuit scale and costs are reduced.

The terms used in the embodiments should be interpreted broadly. For example, the term "processor" may include a general-purpose processor, a central processor (CPU), a microprocessor, a digital signal processor (DSP), a controller, a micro-controller, and a state machine. Depending on situations, the "processor" may indicate an application specific integrated circuit, a field programmable gate array (FPGA), a programmable logic circuit (PLD), and the like. The "processor" may indicate a combination of processing devices such as a plurality of microprocessors, a combination of a DSP and a microprocessor, and one or more microprocessors cooperating with a DSP core.

As another example, the term "memory" may include any electronic component capable of storing electronic information. The "memory" can indicate a random access memory (RAM), a read only memory (ROM), a programmable read only memory (PROM), an erasable programmable read only memory (EPROM), an electrically erasable PROM (EEPROM), a nonvolatile random access memory (NVRAM), a flash memory, and a magnetic or optical data storage.

The data saved in the devices mentioned above can be read by a processor. If the processor performs reads, writes or both reads and writes to the memory, the memory can be considered to be communicating electrically with the processor. The memory can be integrated with the processor. In such cases as well, the memory can be considered as communicating electrically with the processor.

The term "storage device" or "storage" may include any device that can store data using magnetic technology, optical technology, or nonvolatile memory. For example, the storage can be a HDD, an optical disk, a SSD, or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An electronic circuit comprising:
a first delay element to obtain a first signal by delaying a first pulse signal;
a second delay element to obtain a second signal by delaying the first signal;
a first hold circuit to hold a first voltage of an input signal corresponding to the first signal;
a second hold circuit to hold a second voltage of the input signal corresponding to the second signal;
a quantization circuit to obtain a third signal and a fourth signal each with different rising times based on a second pulse signal, to quantize the first voltage based on the third signal, and to quantize the second voltage based on the fourth signal;
a first switch connected to the first hold circuit and the quantization circuit, and to switch according to the third signal; and
a second switch connected the second hold circuit and the quantization circuit, and to switch according to the fourth signal, wherein
the quantization circuit quantizes the first voltage according to a switching of the first switch and quantizes the second voltage according to a switching of the second switch, wherein
the quantization circuit includes a shift register and an analog-to-digital converter,
the shift register obtains the third signal and the fourth signal by delaying the second pulse signal according to a clock signal, provides the third signal to the first switch and provides the fourth signal to the second switch, and
the analog-to-digital converter is connected to the first switch and the second switch.

2. The electronic circuit according to claim 1, wherein
the quantization circuit includes a shift register, a first comparator, a second comparator and a conversion circuit,
the shift register obtains the third signal and the fourth signal by delaying the second pulse signal according to a clock signal, provides the third signal to the first switch and provides the fourth signal to the second switch,
the first comparator is connected to the first switch and the second switch, and compares the first voltage and the second voltage with a first reference voltage, the second comparator is connected to the first switch and the second switch, and compares the first voltage and the second voltage with a second reference voltage and the conversion circuit digitalizes and outputs the first voltage and the second voltage based on at least either comparison of the first voltage at the first comparator, comparison of the second voltage at the first comparator, comparison of the first voltage at the second comparator and comparison of the second voltage at the second comparator.

3. The electronic circuit according to claim 2, wherein the quantization circuit further includes a first amplifier and a second amplifier, wherein the first amplifier amplifies the first voltage, the second voltage and the first reference voltage and provides the first voltage, the second voltage and the first reference voltage to the first comparator, and the second amplifier amplifies the first voltage, the second voltage and the second reference voltage and provides the first voltage, the second voltage and the second reference voltage to the second comparator.

4. The electronic circuit according to claim 1, wherein the quantization circuit includes a third delay element, a fourth delay element, a first comparator, a second comparator and a conversion circuit, wherein the third delay element obtains the third signal by delaying the second pulse signal, the fourth delay element obtains the fourth signal by delaying the third signal, the first comparator is connected to the first switch and the second switch, and compares the first voltage and the second voltage with a first reference voltage, the second comparator is connected to the first switch and the second switch, and compares the first voltage and the second voltage with a second reference voltage, and the conversion circuit digitalizes and outputs the first voltage and the second voltage based on at least either comparison of the first voltage at the first comparator, comparison of the second voltage at the first comparator, comparison of the first voltage at the second comparator and comparison of the second voltage at the second comparator, wherein the third signal is provided to the first switch from the third delay element and the fourth signal is provided to the second switch from the fourth delay element.

5. The electronic circuit according to claim 1, further comprising a semiconductor device provide the input signal; and a second control circuit connected to the semiconductor device and the shift register, wherein the second control circuit determines an applied voltage of the semiconductor device, determines a first timing when the shift register provides the third signal and determines a second timing when the shift register provides the fourth signal.

6. The electronic circuit according to claim 5, further comprising a detection circuit to detect ringing in the applied voltage, wherein the second control circuit determines the first timing and the second timing based on a notification regarding the detected ringing transmitted from the detection circuit.

7. The electronic circuit according to claim 1, further comprising a semiconductor device to provide the input signal;

an input terminal where the signal is input;

a first capacitor connected between the semiconductor device and the input terminal;

a second capacitor connected between the first capacitor and a ground;

a third switch connected between a power supply potential and the input terminal; and a fourth switch connected between the input terminal and the ground.

8. The electronic circuit according to claim 1, further comprising a semiconductor device to provide the input signal;

a signal generator to generate a fifth signal to change an applied voltage of the semiconductor device;

a third comparator to compare the input signal and a reference potential; and a third control circuit connected to the signal generator and the third comparator, wherein the first delay elements is variable delay element, and the third control circuit determines a delay amount in the variable delay element based on a time difference between when the signal generator changed the applied voltage to when an output voltage of the third comparator changes.

9. The electronic circuit according to claim 1, further comprising a semiconductor device;

a first resistor connected to the semiconductor device and a ground;

a second resistor connected to the first resistor;

a third amplifier connected to the second resistor and a reference potential and to provide the input signal; and a third resistor connected between a first node and a second node, wherein the first node is located between the second resistor and the third amplifier, and the second node is located between a second amplifier and the input terminal.

10. The electronic circuit according to claim 1, wherein the quantization circuit includes at least one first comparator, the first comparator including:

a latch circuit including a first inverter and a second inverter;

a differential pair to drive the first inverter and the second inverter in the latch circuit by a current based on a comparison of two voltages entered to the differential pair;

a third switch to switch an operation status of the differential pair;

a fourth resistor connected between the third switch and a reference potential, the latch circuit connected between a power supply potential and the differential pair, and an input terminal of the first inverter is connected to an output terminal and an output terminal of the first inverter is connected to an input terminal.

11. The electronic circuit according to claim 1, wherein the first signal, the second signal and the third signal rises in different timings, respectively.

12. The electronic circuit according to claim 1, wherein the first signal rises earlier than the third signal.

13. The electronic circuit according to claim 1, wherein a pulse width of the second signal is greater than a pulse width of the first signal.

14. The electronic circuit according to claim 1, further comprising:

a first control circuit configured to determine delay amounts of the first delay element and the second delay element which are variable delay elements.

15. An electronic circuit comprising:
a first delay element to obtain a first signal by delaying a first pulse signal;
a second delay element to obtain a second signal by delaying the first signal;
a first hold circuit to hold a first voltage of an input signal corresponding to the first signal;
a second hold circuit to hold a second voltage of the input signal corresponding to the second signal; and
a quantization circuit to obtain a third signal and a fourth signal each with different rising times based on a second pulse signal, to quantize the first voltage based on the third signal, and to quantize the second voltage based on the fourth signal,
the quantization circuit includes at least one first comparator, the first comparator including:
a latch circuit including a first inverter and a second inverter;
a differential pair to drive the first inverter and the second inverter in the latch circuit by a current based on a comparison of two voltages entered to the differential pair;
a third switch to switch an operation status of the differential pair;
a fourth resistor connected between the third switch and a reference potential,
the latch circuit connected between a power supply potential and the differential pair, and
an input terminal of the first inverter is connected to an output terminal and an output terminal of the first inverter is connected to an input terminal.

16. The electronic circuit according to claim 15, further comprising:
a first switch connected to the first hold circuit and the quantization circuit, and to switch according to the third signal; and
a second switch connected the second hold circuit and the quantization circuit, and to switch according to the fourth signal, wherein
the quantization circuit quantizes the first voltage according to a switching of the first switch and quantizes the second voltage according to a switching of the second switch,
the quantization circuit includes a shift register, a first comparator, a second comparator and a conversion circuit,
the shift register obtains the third signal and the fourth signal by delaying the second pulse signal according to a clock signal, provides the third signal to the first switch and provides the fourth signal to the second switch,
the first comparator is connected to the first switch and the second switch, and compares the first voltage and the second voltage with a first reference voltage,
the second comparator is connected to the first switch and the second switch, and compares the first voltage and the second voltage with a second reference voltage and
the conversion circuit digitalizes and outputs the first voltage and the second voltage based on at least either comparison of the first voltage at the first comparator, comparison of the second voltage at the first comparator, comparison of the first voltage at the second comparator and comparison of the second voltage at the second comparator.

17. The electronic circuit according to claim 15, further comprising:
a first switch connected to the first hold circuit and the quantization circuit, and to switch according to the third signal; and
a second switch connected the second hold circuit and the quantization circuit, and to switch according to the fourth signal, wherein
the quantization circuit quantizes the first voltage according to a switching of the first switch and quantizes the second voltage according to a switching of the second switch,
the quantization circuit includes a third delay element, a fourth delay element, a first comparator, a second comparator and a conversion circuit, wherein
the third delay element obtains the third signal by delaying the second pulse signal,
the fourth delay element obtains the fourth signal by delaying the third signal,
the first comparator is connected to the first switch and the second switch, and compares the first voltage and the second voltage with a first reference voltage,
the second comparator is connected to the first switch and the second switch, and compares the first voltage and the second voltage with a second reference voltage, and
the conversion circuit digitalizes and outputs the first voltage and the second voltage based on at least either comparison of the first voltage at the first comparator, comparison of the second voltage at the first comparator, comparison of the first voltage at the second comparator and comparison of the second voltage at the second comparator, wherein
the third signal is provided to the first switch from the third delay element and the fourth signal is provided to the second switch from the fourth delay element.

18. The electronic circuit according to claim 15, further comprising:
a semiconductor device to provide the input signal;
an input terminal where the signal is input;
a first capacitor connected between the semiconductor device and the input terminal;
a second capacitor connected between the first capacitor and a ground;
a third switch connected between a power supply potential and the input terminal; and
a fourth switch connected between the input terminal and the ground.

19. The electronic circuit according to claim 15, further comprising:
a semiconductor device to provide the input signal;
a signal generator to generate a fifth signal to change an applied voltage of the semiconductor device;
a third comparator to compare the input signal and a reference potential; and
a third control circuit connected to the signal generator and the third comparator, wherein
the first delay elements is variable delay element, and
the third control circuit determines a delay amount in the variable delay element based on a time difference between when the signal generator changed the applied voltage to when an output voltage of the third comparator changes.

20. The electronic circuit according to claim 15, further comprising:
a semiconductor device;
a first resistor connected to the semiconductor device and a ground;
a second resistor connected to the first resistor;

a third amplifier connected to the second resistor and a reference potential and to provide the input signal; and a third resistor connected between a first node and a second node, wherein the first node is located between the second resistor and the third amplifier, and the second node is located between a second amplifier and the input terminal.

* * * * *